United States Patent
Lee et al.

(10) Patent No.: US 12,382,687 B2
(45) Date of Patent: Aug. 5, 2025

(54) SEMICONDUCTOR DEVICE INCLUDING INSULATING LAYERS AND METHOD OF MANUFACTURING THE SAME

(71) Applicant: Samsung Electronics Co., Ltd., Suwon-si (KR)

(72) Inventors: Dong Kak Lee, Suwon-si (KR); Min Woo Kim, Suwon-si (KR); Bong Hyun Kim, Suwon-si (KR); Hee Young Park, Suwon-si (KR); Seo Jin Ahn, Suwon-si (KR); Won Yong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/169,327

(22) Filed: Feb. 15, 2023

(65) Prior Publication Data

US 2023/0197789 A1    Jun. 22, 2023

Related U.S. Application Data

(63) Continuation of application No. 16/353,750, filed on Mar. 14, 2019, now Pat. No. 11,605,714.

(30) Foreign Application Priority Data

Sep. 5, 2018 (KR) .................. 10-2018-0106106

(51) Int. Cl.
*H01L 29/40* (2006.01)
*H01L 21/762* (2006.01)
*H10B 12/00* (2023.01)
*H10D 62/17* (2025.01)

(52) U.S. Cl.
CPC ..... *H10D 62/371* (2025.01); *H01L 21/76224* (2013.01); *H10B 12/34* (2023.02); *H10B 12/31* (2023.02)

(58) Field of Classification Search
CPC .................. H01L 29/1083; H01L 29/408
See application file for complete search history.

(56) References Cited

U.S. PATENT DOCUMENTS

| | | |
|---|---|---|
| 5,859,466 A | 1/1999 | Wada |
| 6,133,116 A | 10/2000 | Kim et al. |
| 6,140,691 A | 10/2000 | Gardner et al. |
| 6,413,886 B1 | 7/2002 | Kersch et al. |
| 7,439,605 B2 | 10/2008 | Kobayashi et al. |

(Continued)

FOREIGN PATENT DOCUMENTS

| | | |
|---|---|---|
| CN | 1691330 A | 11/2005 |
| CN | 108133935 A | 6/2018 |

(Continued)

*Primary Examiner* — Michele Fan
(74) *Attorney, Agent, or Firm* — Myers Bigel, P.A.

(57) ABSTRACT

A semiconductor device includes a trench defining an active region in a substrate, a first insulating layer on a bottom surface and side surfaces of the active region inside the trench, a shielding layer on a surface of the first insulating layer, the shielding layer including a plurality of spaced apart particles, a second insulating layer on the shielding layer and having first charge trapped therein, the plurality of spaced apart particles being configured to concentrate second charge having an opposite polarity to the charge trapped in the second insulating layer, and a gap-fill insulating layer on the second insulating layer in the trench.

16 Claims, 22 Drawing Sheets

(56) References Cited

U.S. PATENT DOCUMENTS

| | | |
|---|---|---|
| 9,793,111 B2 | 10/2017 | Nakazawa |
| 10,211,045 B1 | 2/2019 | Krishnan et al. |
| 2002/0076879 A1 | 6/2002 | Lee et al. |
| 2002/0137260 A1 | 9/2002 | Leung et al. |
| 2002/0195680 A1 | 12/2002 | Son |
| 2003/0087485 A1 | 5/2003 | Leung et al. |
| 2004/0140521 A1 | 7/2004 | Okumura et al. |
| 2005/0136618 A1 | 6/2005 | Lee et al. |
| 2005/0230734 A1 | 10/2005 | Ha et al. |
| 2006/0017132 A1 | 1/2006 | Birner et al. |
| 2006/0081903 A1 | 4/2006 | Inoue et al. |
| 2007/0105336 A1 | 5/2007 | Takeoka et al. |
| 2008/0138958 A1 | 6/2008 | Lee |
| 2008/0290390 A1 | 11/2008 | Cha |
| 2009/0104789 A1 | 4/2009 | Mallick et al. |
| 2010/0044802 A1 | 2/2010 | Ishibashi et al. |
| 2010/0078757 A1 | 4/2010 | Eun |
| 2011/0108962 A1 | 5/2011 | Han et al. |
| 2012/0056263 A1 | 3/2012 | Lee et al. |
| 2012/0132984 A1 | 5/2012 | Mifuji et al. |
| 2012/0193596 A1 | 8/2012 | Nakazawa |
| 2013/0292791 A1 | 11/2013 | Lin et al. |
| 2014/0332932 A1 | 11/2014 | Zhang et al. |
| 2017/0018552 A1 | 1/2017 | Moon et al. |
| 2018/0158828 A1 | 6/2018 | Han et al. |
| 2018/0286871 A1 | 10/2018 | Chang et al. |

FOREIGN PATENT DOCUMENTS

| | | |
|---|---|---|
| KR | 970053400 A | 7/1997 |
| KR | 19980053673 A | 9/1998 |
| KR | 19990026216 A | 4/1999 |
| KR | 20000018499 A | 4/2000 |
| KR | 100361520 B1 | 11/2002 |
| KR | 20040060318 A | 7/2004 |
| KR | 20050002389 A | 1/2005 |
| KR | 1020060002057 A | 1/2006 |
| KR | 20070002698 A | 1/2007 |
| KR | 1020070001740 A | 1/2007 |
| KR | 20080060594 A | 7/2008 |
| KR | 20080084256 A | 9/2008 |
| KR | 1020120025873 A | 3/2012 |
| KR | 20120090544 A | 8/2012 |
| KR | 1020170010267 A | 1/2017 |

SEMICONDUCTOR DEVICE INCLUDING INSULATING LAYERS AND METHOD OF MANUFACTURING THE SAME

CROSS-REFERENCE TO RELATED APPLICATION

This application is a continuation of U.S. patent application Ser. No. 16/353,750, filed Mar. 14, 2019, which claims the benefit of priority from Korean Patent Application No. 10-2018-0106106, filed Sep. 5, 2018, in the Korean Intellectual Property Office, the disclosures of which are incorporated herein by reference in their entirety.

BACKGROUND

1. Field

Devices and methods consistent with example embodiments relate to a semiconductor device having a device isolation layer and a method of manufacturing the same.

2. Description of Related Art

With an increase in integration density of semiconductor devices, design rules for components of the semiconductor devices have been reduced. For example, a gate length, which is a standard of the design rule, may be reduced in a semiconductor device that requires a large number of transistors. Thus, voltage and current characteristics of highly downscaled semiconductor devices may be degraded.

SUMMARY

The example embodiments of the inventive concept are directed to providing a semiconductor device having a structure configured to reduce or prevent the occurrence of a hot electron induced punchthrough (HEIP) phenomenon in a semiconductor device that is downscaled with an increase in the integration density of semiconductor devices.

In addition, the example embodiments of the inventive concept are directed to providing a method of manufacturing a semiconductor device, by which a structure configured to reduce or prevent the occurrence of an HEIP phenomenon may be effectively manufactured in a semiconductor device that is downscaled with an increase in the integration density of semiconductor devices.

According to example embodiments, there is provided a semiconductor device including a trench defining an active region in a substrate, a first insulating layer on a bottom surface and side surfaces of the active region inside the trench, a shielding layer on a surface of the first insulating layer, the shielding layer comprising a plurality of spaced apart particles, a second insulating layer on the shielding layer, and a gap-fill insulating layer on the second insulating layer in the trench.

According to example embodiments, there is provided a semiconductor device including a trench defining an active region in a substrate, a first insulating layer on a bottom surface and side surfaces of the active region inside the trench, a shielding layer on a surface of the first insulating layer, the shielding layer exposing a portion of the surface of the first insulating layer, a second insulating layer on the shielding layer, and a gap-fill insulating layer on the second insulating layer in the trench. The first insulating layer includes a protrusion formed in at least a portion of a surface thereof.

According to example embodiments, there is provided a semiconductor device including an active region in a substrate, a device isolation layer defining the active region, a gate structure disposed on the active region and the device isolation layer and extending in an X-axial direction, a bit line structure on the gate structure and extending in a Y-axial direction intersecting the X-axial direction, and a storage node contact on an end portion of the active region adjacent to the bit line structure. The device isolation layer includes a first insulating layer in contact with the active region, a shielding layer on the first insulating layer and including a plurality of particles, and a second insulating layer on the shielding layer.

DETAILED DESCRIPTION

Figure 1A:
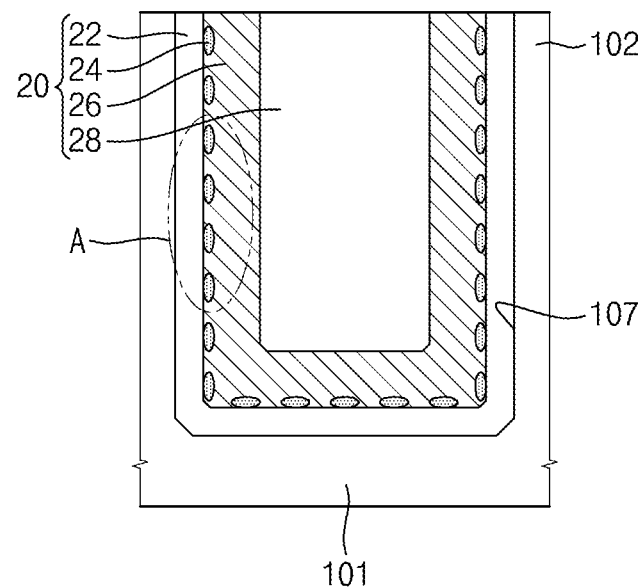
FIG. 1A is a cross-sectional view of some components of a semiconductor device according to some embodiments of the inventive concept.

The inventive concept will now be described more fully with reference to the accompanying drawings, in which example embodiments of the inventive concept are shown. Like reference numerals may refer to like elements throughout this application. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1B:
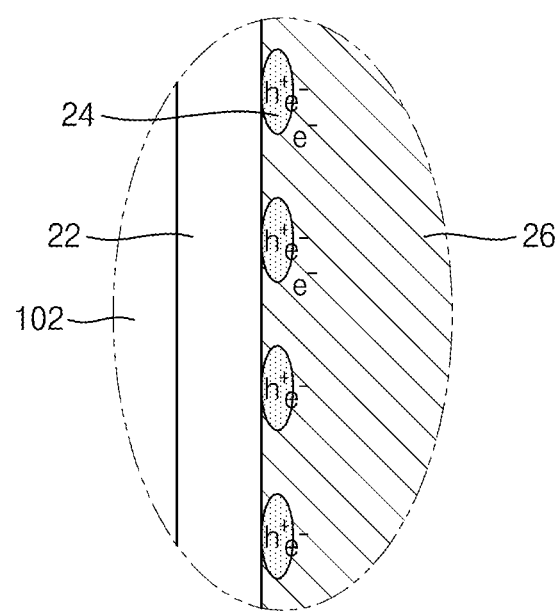
FIG. 1B is a schematic cross-sectional view illustrating a phenomenon where holes and electrons are charged in a region illustrated as portion A in FIG. 1A.
Figure 1C:
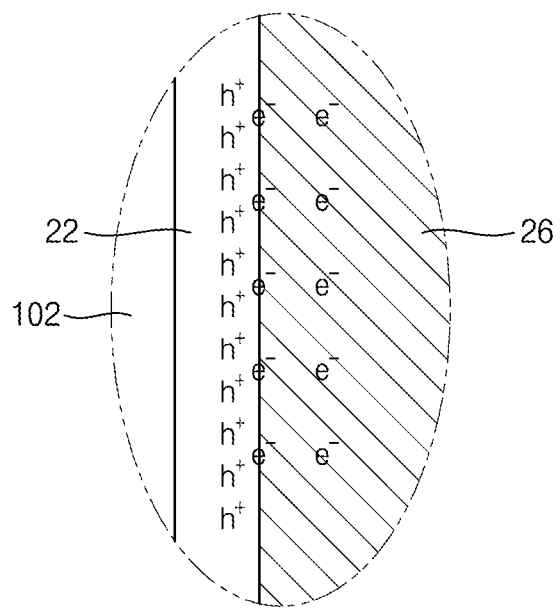
FIG. 1C is a cross-sectional view that illustrates a semiconductor device according to some embodiments of the inventive concept as an example for comparison with FIG. 1A.
Figure 1D:
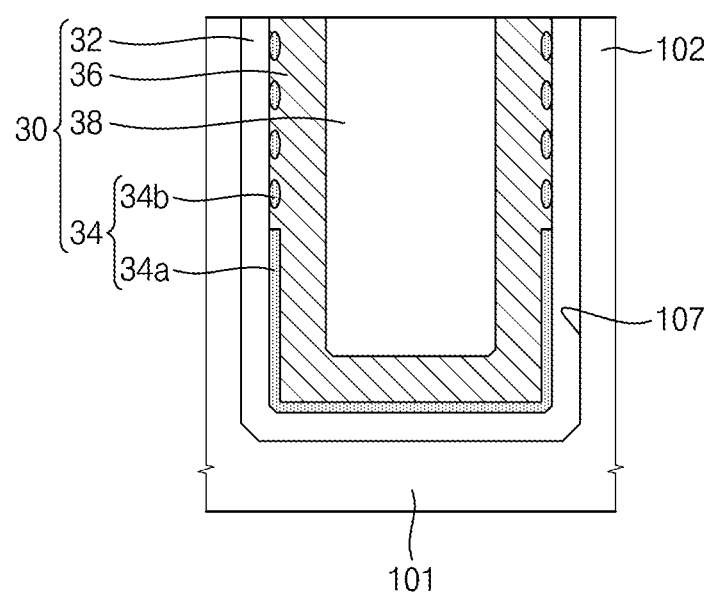
FIG. 1D is a cross-sectional view of some components of a semiconductor device according to further embodiments of the inventive concept.

FIG. 1A is a cross-sectional view of some components of a semiconductor device according to some embodiments of the inventive concept. FIG. 1B is a schematic cross-sectional view illustrating a phenomenon where holes and electrons are charged in a region illustrated as portion A in FIG. 1A. FIG. 1C is a cross-sectional view that illustrates a semiconductor device according to some embodiments of the inventive concept as an example for comparison with FIG. 1A. FIG. 1D is a cross-sectional view of some components of a semiconductor device according to further embodiments of the inventive concept.

Referring to FIG. 1A, the semiconductor device may include a substrate 101 and a device isolation layer 20. A trench 107 defining an active region 102 may be formed in the substrate 101, and a device isolation layer 20 may be disposed inside the trench 107. The device isolation layer 20 may have, for example, a shallow trench isolation (STI) structure having a generally small width and generally good isolation characteristics.

In some embodiments, the device isolation layer 20 may include a first insulating layer 22 disposed on a surface of the trench 107, a shielding layer 24 disposed on the first insulating layer 22, a second insulating layer 26 disposed on the shielding layer 24, and a gap-fill insulating layer 28 disposed on the second insulating layer 26. The gap-fill insulating layer 28 may be formed in the trench 107 so as to at least partially fill the trench 107. The first insulating layer 22 and the gap-fill insulating layer 28 may be formed of oxide, and the second insulating layer 26 may be formed of nitride. The shielding layer 24 may include, for example, polysilicon doped with impurities, tungsten, and/or titanium nitride. The shielding layer 24 may include polysilicon doped with oxygen, nitrogen, and/or carbon. However, embodiments of the inventive concept are not limited thereto.

A semiconductor device, in which a structure shown in FIG. 1A according to some embodiments may be extended, may be a transistor semiconductor device, which may further include a gate structure (e.g., 130 of FIGS. 20 and 21, 140 of FIGS. 22 and 23, and 560 of FIG. 30) formed on an active region 102 defined by a device isolation layer 20. For example, when the gate structure constitutes a portion of a P-type metal-oxide-semiconductor (pMOS) transistor, electrons may be trapped in a portion of the device isolation layer 20, and holes h+ may be charged on an opposite side of the portion of the device isolation layer 20.

Referring to FIG. 1A and FIG. 1B, as semiconductor devices are sharply downscaled, an electric field between channels may rapidly increase, and many hot electrons may be generated. For example, in a pMOS transistor, holes as carriers may collide with a lattice of a drain region to which a high electric field is applied so that electron-hole pairs may be generated to generate many hot electrons.

The hot electrons may penetrate a device isolation layer and be trapped in a nitride layer. That is, because the second insulating layer 26 formed of nitride is disposed between the first insulating layer 22 and the gap-fill insulating layer 28, which are oxide layers, a potential difference may occur in the second insulating layer 26 so that electrons may be trapped in the second insulating layer 26.

The electrons trapped due to the potential difference may not only be trapped in the nitride layer (i.e., the second insulating layer 26), but also trapped at an interface between the conductive shielding layer 24 (e.g., polysilicon doped with impurities) and the second insulating layer 26. For example, a position at which the electrons are trapped may correspond to an internal lattice defect of the second insulating layer 26 and/or a defect present at the interface between the shielding layer 24 and the second insulating layer 26.

The trapped electrons may attract holes h+ having an opposite type of electric charge by electrical attraction, and the holes h+ may mainly concentrate into the shielding layer 24 and be charged. That is, due to the presence of the shielding layer 24, capability of the trapped electrons to attract the holes h+ into the active region 102 of the semiconductor substrate 101 may be reduced. Accordingly, even if the electrons are trapped in the device isolation layer 20, the holes h+ may not concentrate in the active region 102 of the semiconductor substrate 101 adjacent to the device isolation layer 20.

Because the holes h+ have not concentrated in the active region 102 of the semiconductor substrate 101 adjacent to the device isolation layer 20, a length of an effective channel formed in the active region 102 may not be changed and, thus, the likelihood of the semiconductor device operating abnormally may be reduced or prevented.

In some embodiments, the shielding layer 24 may include particles spaced apart from each other. Although the particles are illustrated as being spaced apart from each other at regular intervals, the distribution of the particles is not limited thereto and the particles may be spaced apart from each other at irregular intervals. A plurality of particles may have different sizes and shapes in accordance with various embodiments of the inventive concept.

A conductive structure (e.g., a storage node contact BC, a direct contact DC, and a gate electrode 132 of FIG. 2I) may be formed over the entire region between an insulating layer and the active region 102 of the semiconductor substrate 101. Accordingly, when a top end of the shielding layer 24 is exposed on a top surface of the semiconductor substrate 101, that is, when the top end of the shielding layer 24 is at the same level as the top surface of the semiconductor substrate 101, the conductive structure may be brought into contact with the shielding layer 24 to degrade one or more operational capabilities of a device.

To reduce the likelihood or prevent the above-described phenomenon, according to some embodiments of the inventive concept, the shielding layer 24 may be formed of a plurality of particles spaced apart from each other to obtain separation between the plurality of particles. Thus, contact between the shielding layer 24 and the conductive structure may be reduced or prevented. Further, even if the particles of the shielding layer 24 are brought into contact with the conductive structure, operation of a device may not be affected. Thus, the shielding layer 24 including the plurality of particles may reduce the likelihood of or prevent a hot electron induced punchthrough (HEIP) phenomenon and also reduce or prevent device defects due to the conductive structure.

Referring to FIG. 1C, unlike in FIG. 1A, the semiconductor device may not include the shielding layer 24. As semiconductor devices are sharply downscaled, an electric field between channels may greatly increase, and many hot electrons may be generated. The hot electrons may penetrate the device isolation layer 20 and be trapped in a second insulating layer 26 formed of nitride. That is, because the second insulating layer 26 formed of nitride is disposed between the first insulating layer 22 and the gap-fill insulating layer 28 formed of oxides, a potential difference may be generated in the second insulating layer 26 so that electrons e− may be trapped in the second insulating layer 26. The electrons e− trapped due to the potential difference may not only be trapped in the second insulating layer 26 but also trapped at an interface between the first insulating layer 22 and the second insulating layer 26.

The trapped electrons e− may attract holes h+, which have an opposite type of electric charge, due to electrical attraction. The holes h+ may concentrate into the active region 102 of the semiconductor substrate 101 adjacent to the device isolation layer 20 and be charged. When the holes h+ concentrate into the active region 102 adjacent to the device isolation layer 20, a length of an effective channel may be less than an original length. Thus, current may flow even when a voltage is not applied to a gate, a threshold voltage may be reduced, and a leakage current may increase. This may result in one or more device defects. This phenomenon may be called hot electron induced punchthrough (HEIP). The HEIP phenomenon may be problematic in a pMOS region in which holes h+ are main carriers and Vpp is applied at a high voltage. However, as described above, because the shielding layer 24 is present as shown in FIG. 1A, the holes h+ may neither concentrate into the active region 102 of the semiconductor substrate 101 nor be charged, and the HEIP phenomenon may be mitigated or prevented.

Referring to FIG. 1D, a device isolation layer 30 may include a first insulating layer 32, a shielding layer 34, a second insulating layer 36, and a gap-fill insulating layer 38.

In some embodiments of the inventive concept, the shielding layer 34 may include a liner layer 34a and a plurality of particles 34b. The liner layer 34a may extend along side surfaces and a bottom surface of the first insulating layer 32. The liner layer 34a may at least partially cover lower side surfaces of the first insulating layer 32 and may not cover or expose upper side surfaces of the first insulating layer 32. A top end of the liner layer 34a may be formed at a lower level than a top surface of a semiconductor substrate 101 so as to be in a recessed region thereof and may be spaced a predetermined depth apart from the top surface of the semiconductor substrate 101. When the predetermined depth is excessively small, a device defect may occur due to contact between a conductive structure and the liner layer 34a. Thus, the predetermined depth may be appropriately controlled based on characteristics of the semiconductor device.

The plurality of particles 34b may be disposed on the first insulating layer 32 and be spaced apart from the liner layer 34a. The plurality of particles 34b may be disposed apart from each other. As described above, the plurality of particles 34b may be spaced apart so that an HEIP phenomenon may be mitigated or prevented and a device defect due to contact with the conductive structure may also be reduced in its effect or prevented.

Figure 1E:
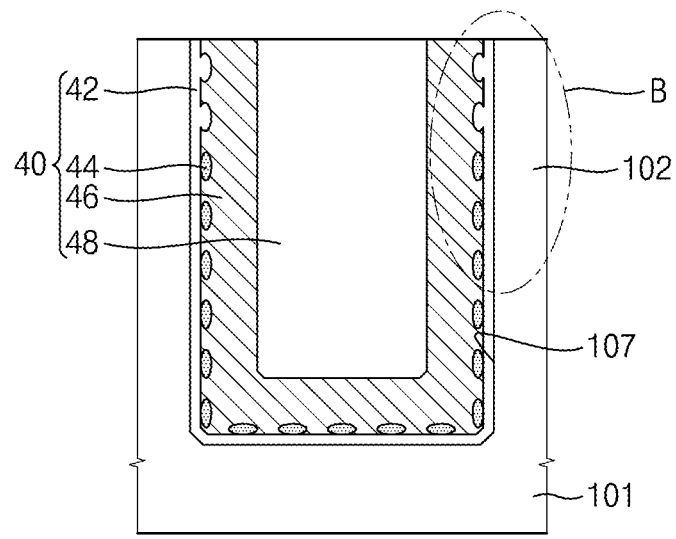
FIGS. 1E and 1F are cross-sectional views of some components of a semiconductor device according to further embodiments of the inventive concept.
Figure 1F:
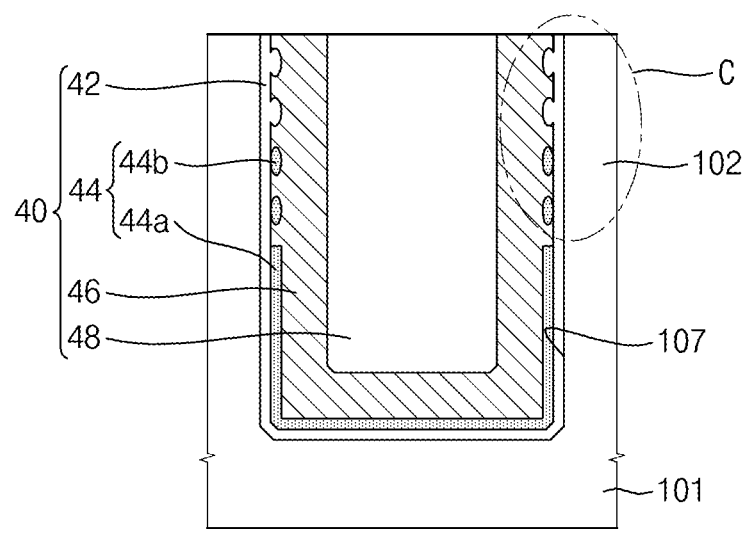
Figure 1G:
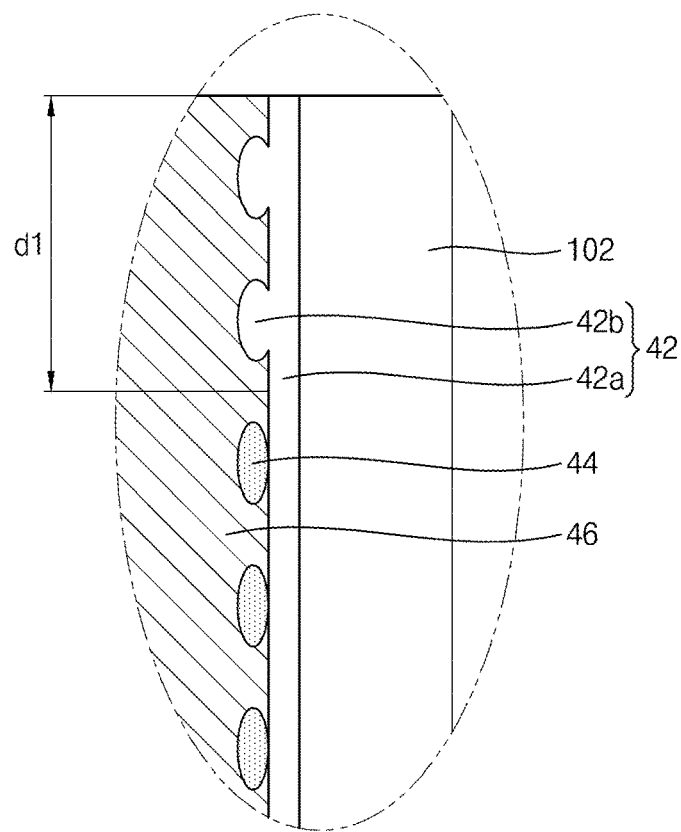
FIGS. 1G to 1I are enlarged views of portion B of FIG. 1E, according to some embodiments of the inventive concept.
Figure 1H:
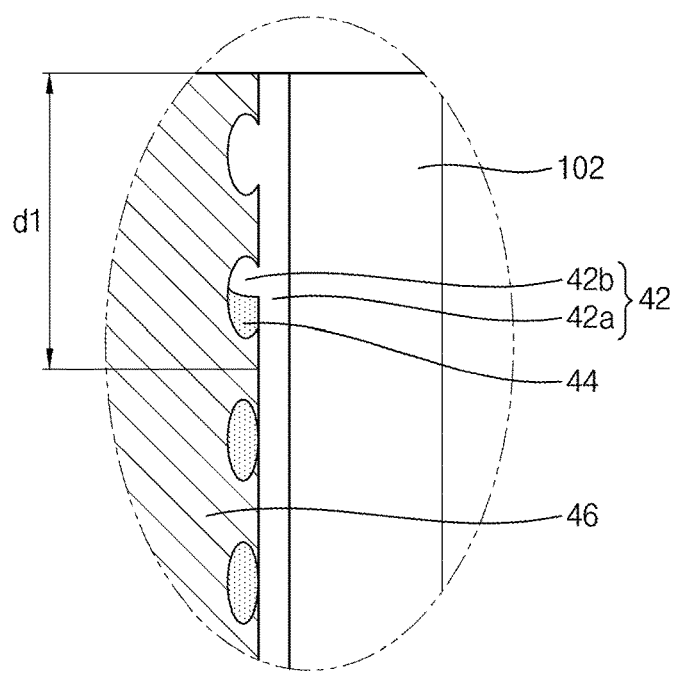
Figure 1I:
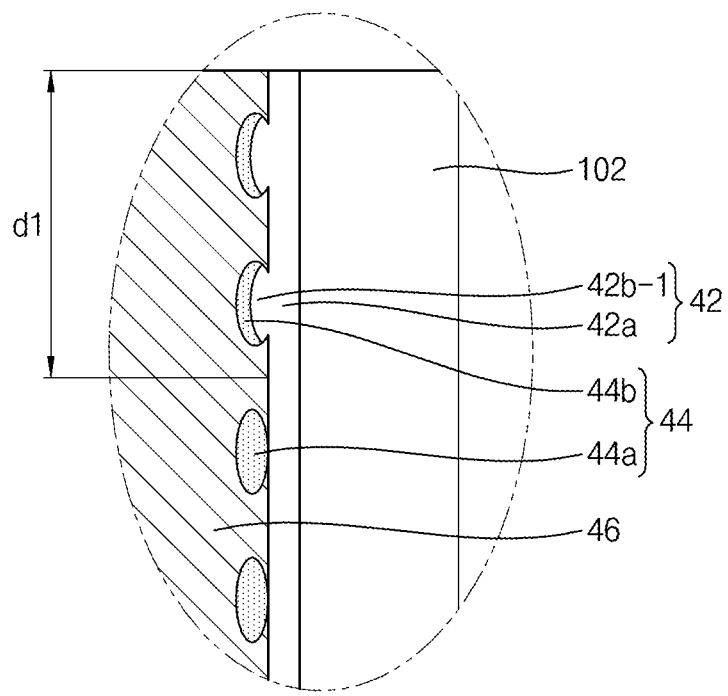

FIGS. 1E and 1F are cross-sectional views of some components of a semiconductor device according to some embodiments of the inventive concept. FIGS. 1G to 1I are enlarged views of portion B of FIG. 1E, according to some embodiments. In FIGS. 1A to 1I, like reference numerals refer to like elements. Hereinafter, substantially the same descriptions as set forth above with reference to the embodiments of FIGS. 1A to 1D will be omitted for brevity.

Referring to FIGS. 1E and 1G, a device isolation layer 40 may include a first insulating layer 42, a shielding layer 44, a second insulating layer 46, and a gap-fill insulating layer 48. In some embodiments, the first insulating layer 42 may include a liner unit 42a, which is conformally formed inside a trench 107, and protrusions 42b, which protrude from the liner unit 42a into the trench 107. A surface of the first insulating layer 42, on which the protrusions 42b are formed, may have a rough or irregular shape. The protrusions 42b may be disposed in an upper portion of the trench 107. For example, the protrusions 42b may be disposed at a position having a depth d1 of about 100 Å or less from a top end of the first insulating layer 42 (or a top end of the trench 107). The protrusions 42b may be disposed apart from the shielding layer 44. The protrusions 42b may be formed by oxidizing portions of the shielding layer 44 due to a subsequent thermal treatment process or the like that is performed after the device isolation layer 40 is formed.

Referring to FIGS. 1E and 1H, a portion of the protrusion 42b may be in contact with the shielding layer 44. Because subsequent processes performed after the device isolation layer 40 is formed are performed on the device isolation layer 40, when the shielding layer 44 is disposed on a further upper portion of the trench 107, an oxidation process may easily occur due to the subsequent processes. Thus, some of a plurality of particles of the shielding layer 44 may not be completely oxidized, but only upper portions of the particles of the shielding layer 44 may be oxidized, and an unoxidized portion of the shielding layer 44 may be in contact with an oxidized portion thereof. The oxidized portion of the shielding layer 44 may form the protrusions 42b of the first insulating layer 42.

Referring to FIGS. 1E and 1I, some of the particles of the shielding layer 44 may be disposed on the protrusion 42b. A portion of the shielding layer 44 that is in contact with the first insulating layer 42 may be oxidized, and the oxidized portion of the shielding layer 44 may form the protrusions 42b of the first insulating layer 42. Although not shown, the shielding layer 44 and the first insulating layer 42 shown in FIGS. 1H and 1I according to the various embodiments may be integrated into a first insulating layer.

Referring to FIG. 1F, the shielding layer 44 may include a liner layer 44a and a plurality of particles 44b. Portion C of FIG. 1F may correspond to any one of FIGS. 1G to 1I.

Figure 1J:
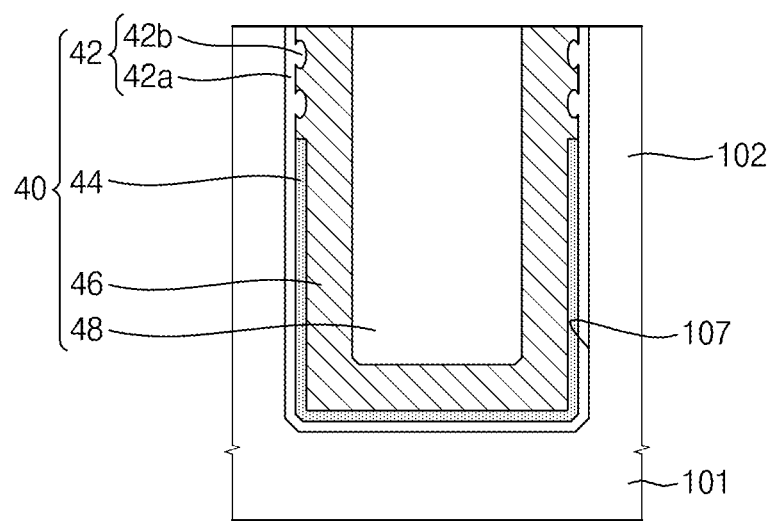
FIGS. 1J and 1K are cross-sectional views of some components of a semiconductor device according to further embodiments of the inventive concept.
Figure 1K:
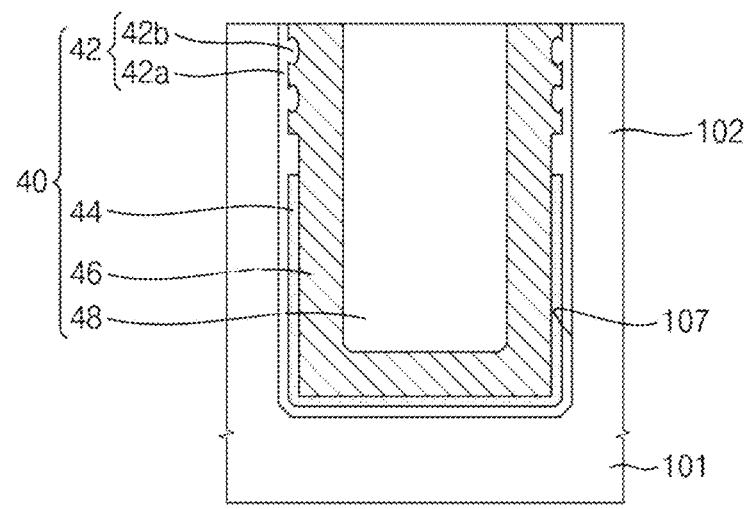

FIGS. 1J and 1K are cross-sectional views of some components of a semiconductor device according to some embodiments of the inventive concept. In FIGS. 1A to 1K, like reference numerals refer to like elements. Hereinafter, substantially the same descriptions as set forth above with reference to the embodiments of FIGS. 1A to 1I will be omitted for brevity.

Referring to FIG. 1J, a shielding layer 44 may be formed as a liner type and conformally cover a portion of a first insulating layer 42. The liner-type shielding layer 44 may be spaced apart from protrusions 42b disposed on the first insulating layer 42 and at least partially cover lower sidewalls and a bottom surface of the first insulating layer 42.

Referring to FIG. 1K, a top end of the liner-type shielding layer 44 may be in contact with a lower end of the protrusions 42b. The protrusions 42b of the first insulating layer 42 may be formed by oxidizing not only particles of the shielding layer 44 but also a top end of a liner layer.

Figure 2A:
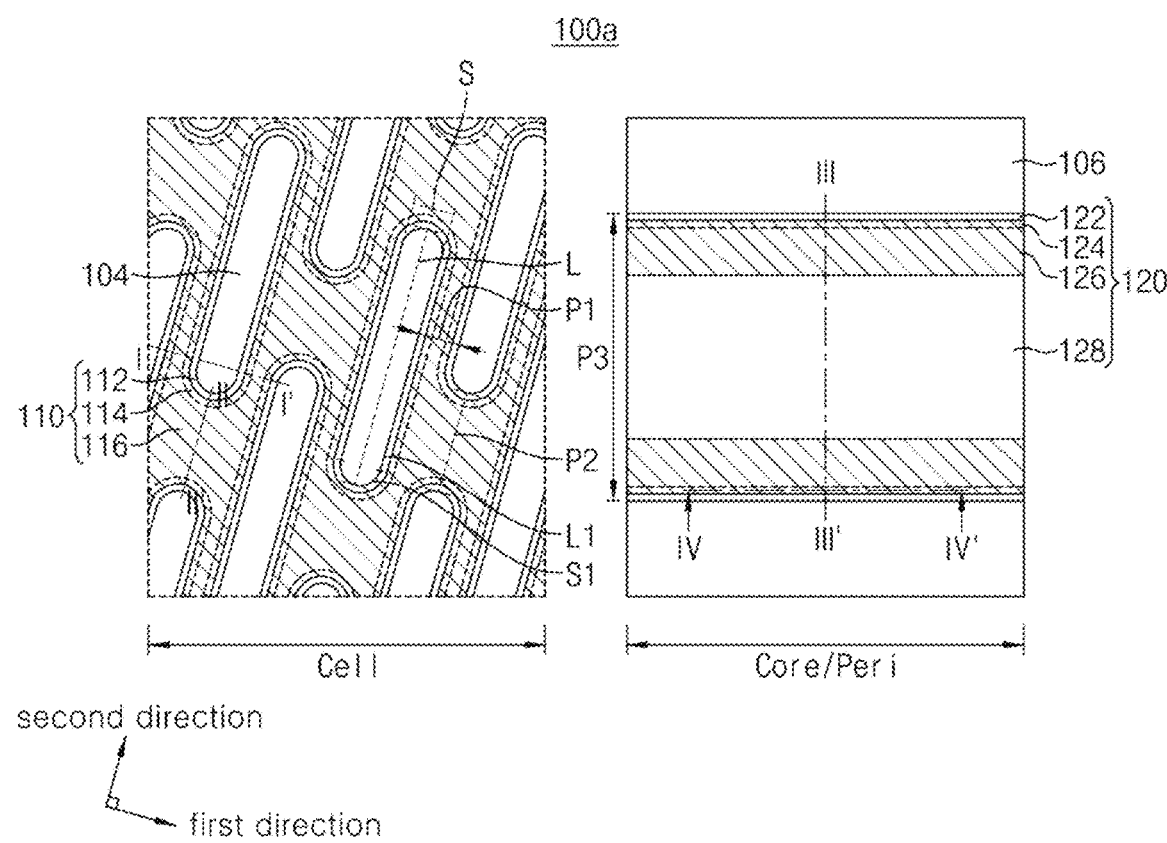
FIG. 2A is a plan view of some components of a semiconductor device according to further embodiments of the inventive concept.
Figure 2B:
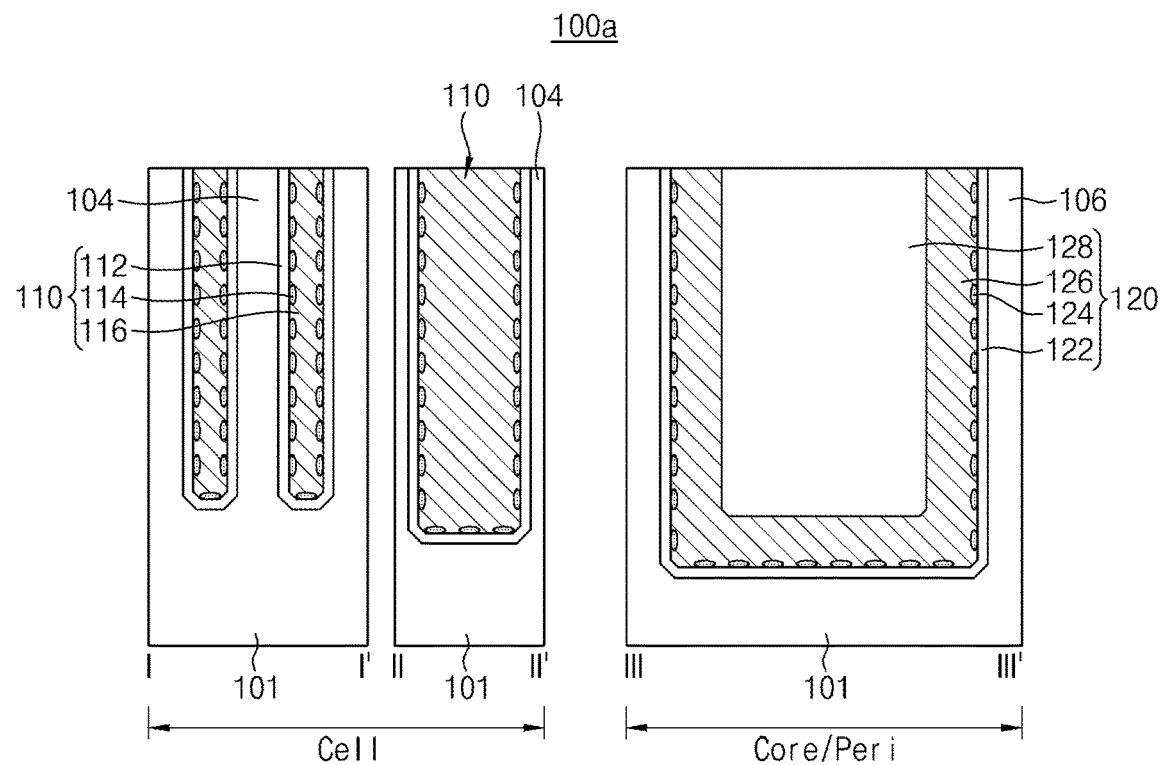
FIG. 2B shows cross-sectional views taken along lines I-I', II-II', and III-III' of FIG. 2A.
Figure 3:
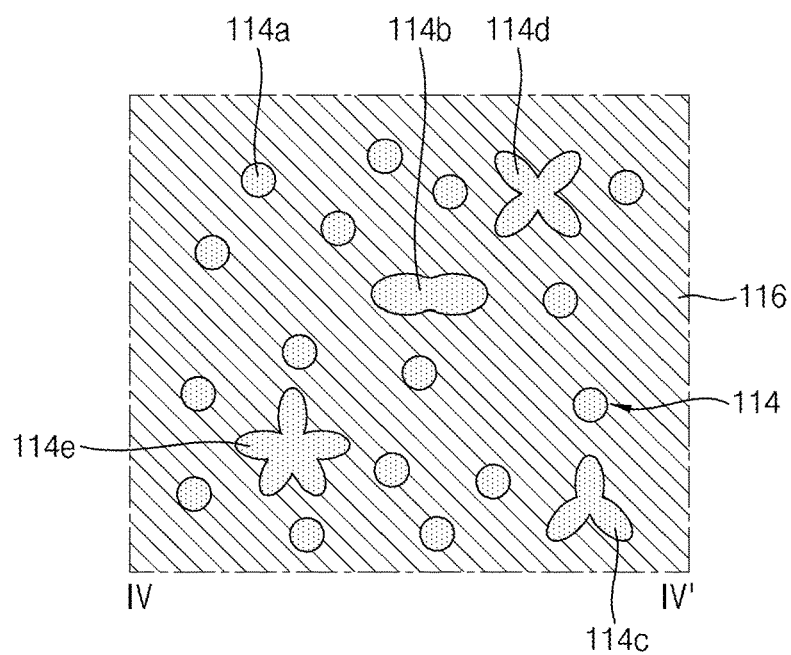
FIG. 3 is a cross-sectional view taken along a line VI-VI' of FIG. 2A.

FIG. 2A is a plan view of some components of a semiconductor device according to some embodiments of the inventive concept. FIG. 2B shows cross-sectional views taken along lines I-I', II-II', and III-III' of FIG. 2A. FIG. 3 is a cross-sectional view taken along a line VI-VI' of FIG. 2A.

Referring to FIGS. 2A and 2B, the semiconductor device according to some embodiments of the inventive concept may include a substrate 101 having a first region Cell and a second region Core/Peri having different densities of their respective active regions.

The substrate 101 may be a semiconductor substrate 101, such as a silicon wafer. The substrate 101 may include, but is not limited to, single crystalline silicon, polycrystalline silicon, or amorphous silicon. The substrate 101 may include at least one material selected from germanium (Ge), silicon germanium (SiGe), silicon carbide (SiC), gallium arsenide (GaAs), indium arsenide (InAs), and indium phosphide (InP). The substrate 101 may include a conductive region.

The first region Cell may be a high-density region including active regions at a relatively high density, and the second region Core/Peri may be a low-density region including active regions at a relatively low density.

The first region Cell may be a cell array region of a semiconductor memory device. For example, a volatile memory cell array, such as a dynamic random access memory (DRAM), may be formed in the first region Cell. Alternatively, a non-volatile memory cell array, such as a flash memory, may be formed in the first region Cell.

Peripheral circuits electrically connected to cell arrays formed in the first region Cell may be formed in the second region Core/Peri. The second region Core/Peri may include a region (e.g., a core region) in which the cell arrays are not formed. Hereinafter, a "peripheral circuit region" may refer to a region in which the above-described peripheral circuits are formed or a core region.

The semiconductor device may include a cell active region 104 and a cell device isolation layer 110 in the first region Cell. The cell device isolation layer 110 may define the cell active region 104.

Each of the cell active regions 104 may include a top surface having a short axis S, which is in a first direction, and a long axis L, which is in a second direction. Each of the cell active regions 104 may include a short sidewall S1 having the same or similar width as the short axis S and a long sidewall L1 parallel to the long axis L.

A plurality of cell active regions 104 may be formed. The plurality of cell active regions 104 may be spaced apart from each other by a first width P1 in the first direction. Further, the plurality of cell active regions 104 may be spaced apart from each other by a second width P2 in the second direction, and the second width P2 may be greater than the first width P1.

The plurality of cell active regions 104 may be repeatedly and regularly disposed in the first direction and the second direction. The plurality of cell active regions 104 may be disposed in a zigzag configuration and may only partially overlap each other in the first direction. The plurality of cell active regions 104 may be disposed in a row in the second direction.

In some embodiments, the cell device isolation layer 110 may include a first insulating layer 112, a cell shielding layer 114, and a second insulating layer 116.

The first insulating layer 112 may at least partially surround each of the plurality of cell active regions 104 between the plurality of cell active regions 104 that are spaced apart from each other. For example, the first insulating layer 112 may be in contact with the long sidewall L1 of the cell active region 104 and extend in the second direction and also be in contact with the short sidewall S1 of the cell active region 104 and extend in the second direction.

In some embodiments of the inventive concept, a thickness of the first insulating layer 112 may be smaller than half of the first width P1. Thus, a remaining space may be formed between the first insulating layers 112 and continuously extend in the first direction and the second direction. In some embodiments, the first insulating layer 112 may be formed of oxide.

The cell shielding layer 114 may include a plurality of particles and be disposed on the first insulating layer 112. The plurality of particles may be spaced apart from each other, and a surface of the first insulating layer 112 may be exposed between the spaced apart particles. Although the particles are illustrated as being spaced apart from each other by a constant distance, embodiments of the inventive concept are not limited thereto, and the particles may be spaced from each other by irregular or varying distances. The plurality of particles may have different sizes and shapes. The cell shielding layer 114 may include, for example, one or more materials including, but not limited to, polysilicon doped with impurities, tungsten, or titanium nitride.

The second insulating layer 116 may be disposed on the cell shielding layer 114. In some embodiments, the second insulating layer 116 may continuously extend in the first direction and the second direction. The second insulating layer 116 may at least partially cover the particles of the cell shielding layer 114 and be in contact with the surface of the first insulating layer 112, which is exposed between the particles. The second insulating layer 116 may at least partially cover both an inner wall of the first insulating layer 112 and the cell shielding layer 114. The second insulating layer 116 may be disposed in the remaining space formed between the first insulating layers 112 so as to partially or substantially completely fill the remaining space formed between the first insulating layers 112. Side surfaces and a bottom surface of the second insulating layer 116 may be at least partially surrounded by the first insulating layer 112. In some embodiments, the second insulating layer 116 may be formed of nitride.

The semiconductor device according to some embodiments of the inventive concept may include a peripheral active region 106 and a peripheral device isolation layer 120 in the second region Core/Peri. A plurality of peripheral active regions 106 may be formed. The peripheral device isolation layer 120 may define the peripheral active region 106 and have a third width P3 that is greater than the first width P1 of the cell device isolation layer 110.

In some embodiments of the inventive concept, the peripheral device isolation layer 120 may include a first insulating liner 122, a peripheral shielding layer 124, a second insulating liner 126, and a gap-fill insulating layer 128.

The first insulating liner 122 may be in contact with sidewalls of the peripheral active region 106 between the plurality of peripheral active regions 106 that are spaced apart from each other. For example, a thickness of the first insulating liner 122 may be similar or equal to a thickness of the first insulating layer 112. In some embodiments of the inventive concept, the first insulating liner 122 may be formed of the same material as the first insulating layer 112. In some embodiments, the first insulating liner 122 may include oxide.

The peripheral shielding layer 124 may be disposed on the first insulating liner 122 and include a plurality of particles. The plurality of particles may be spaced apart from each other, and the surface of the first insulating layer 112 may be exposed between the spaced particles. Although the particles are illustrated as being spaced apart from each other by a constant distance, embodiments of the inventive concept are not limited thereto, and the particles may be spaced from each other by irregular or varying distances. The plurality of particles may have different sizes and shapes. In some embodiments, the peripheral shielding layer 124 may include a similar material or the same material as the cell shielding layer 114. The peripheral shielding layer 124 may include, for example, one or more materials including, but not limited to, polysilicon doped with impurities, tungsten, and titanium nitride.

The second insulating liner 126 may be disposed on the peripheral shielding layer 124. The second insulating layer 116 may at least partially cover the particles of the cell shielding layer 114 and be in contact with surfaces of the first insulating liner 122 exposed between the particles. The second insulating liner 126 may at least partially cover both an inner wall of the first insulating liner 122 and the peripheral shielding layer 124. A remaining space may be formed between the second insulating liners 126. Side surfaces and a bottom surface of the second insulating liner 126 may be at least partially surrounded by the first insulating liner 122. In some embodiments of the inventive concept, the second insulating liner 126 may be formed of a similar material or the same material as the second insulating layer 116. In some embodiments, the second insulating liner 126 may be formed of nitride.

The gap-fill insulating layer 128 may be disposed on the second insulating liner 126. The gap-fill insulating layer 128 may be disposed in the remaining spaced formed between the second insulating liners 126 so as to partially or substantially completely fill the remaining space formed between the second insulating liners 126. In some embodiments, the gap-fill insulating layer 128 may include oxide.

Referring to FIG. 3, the cell shielding layer 114 may include a plurality of particles of which surfaces are at least partially surrounded by the second insulating layer 116. The plurality of particles may be spaced apart from each other on the same plane. In some embodiments of the inventive concept, the plurality of particles may have different sizes and shapes. For example, the particles may have a thickness of about 1 Å to about 200 Å in some embodiments, and about 1 Å to about 50 Å in other embodiments, but embodiments of the inventive concept are not limited thereto. For example, a plurality of particles 114a may have a shape, such as a spherical shape or a hemispherical shape in accordance with various embodiments of the inventive concept. A plurality of particles 114a, 114b, 114c, 114d, and 114e may have shapes formed by combining particles having a spherical or hemispherical shape.

Figure 4:
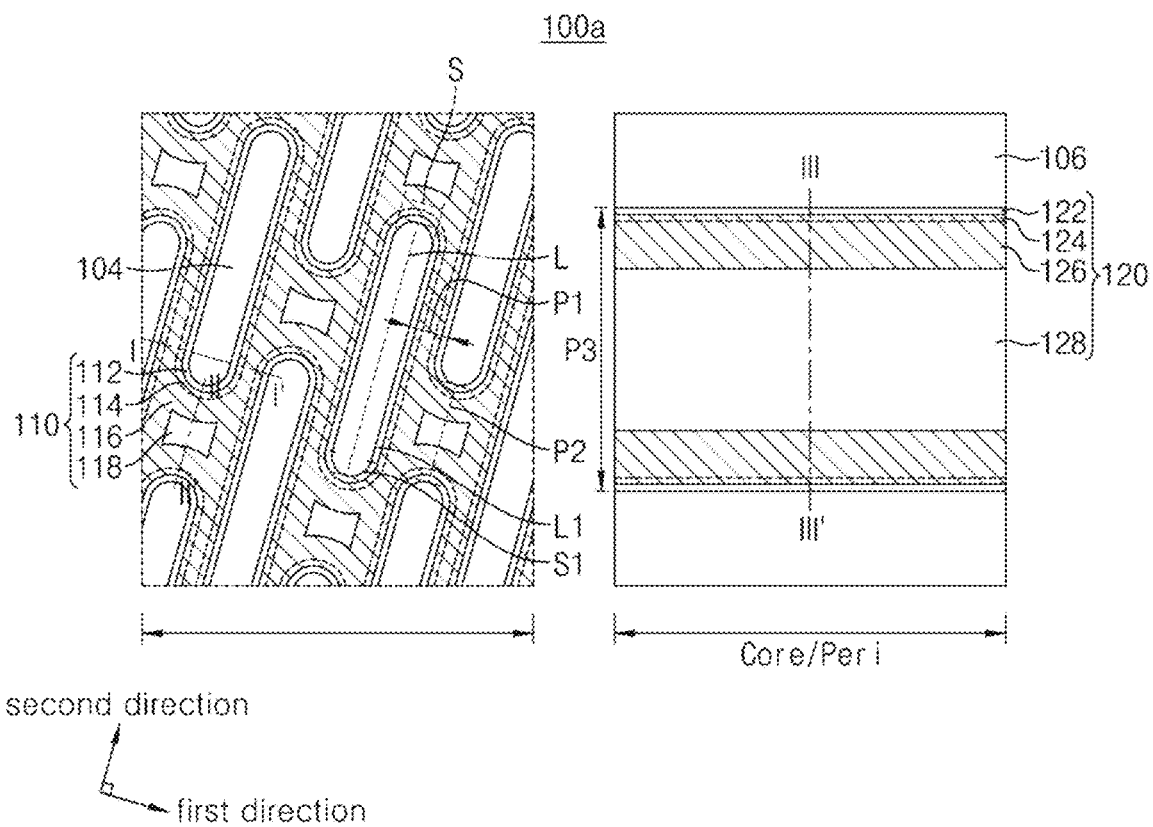
FIG. 4 is a plan view of some components of a semiconductor device according to further embodiments of the inventive concept.
Figure 5:
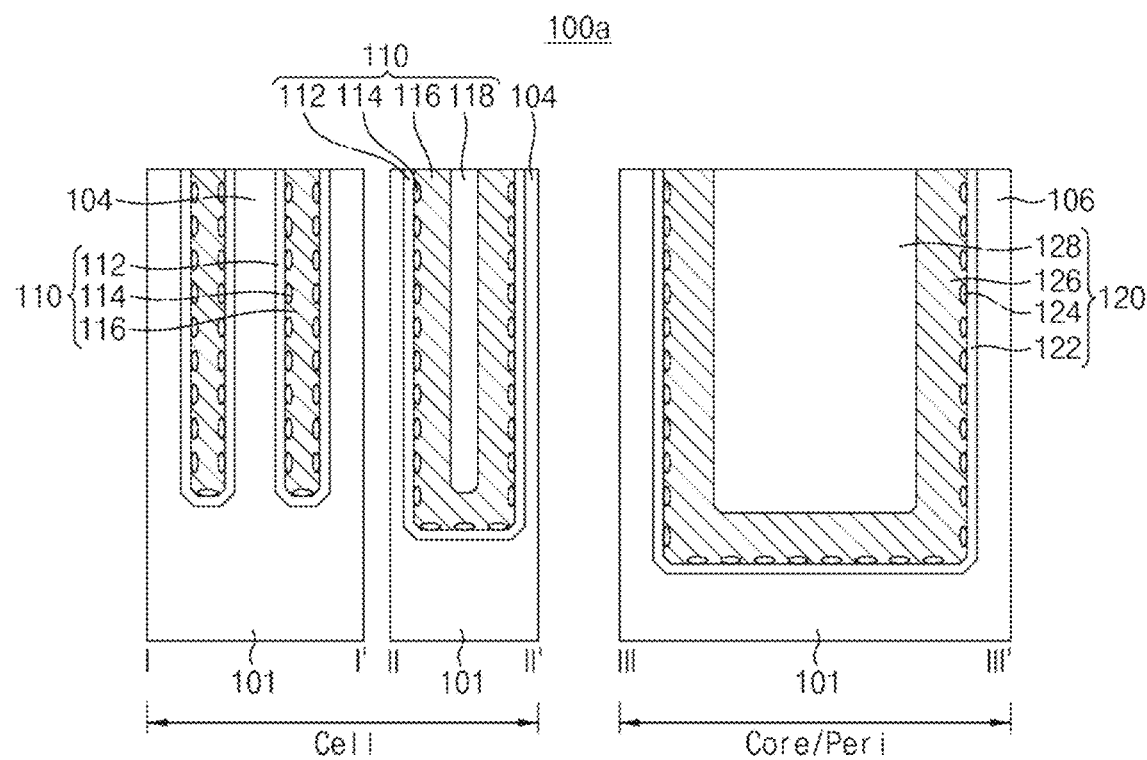
FIG. 5 shows cross-sectional views taken along lines I-I', II-II', and III-III' of FIG. 4.

FIG. 4 is a plan view of some components of a semiconductor device according to some embodiments of the inventive concept. FIG. 5 shows cross-sectional views taken along lines I-I', II-II', and III-III' of FIG. 4. In FIGS. 1A to 5, like reference numerals refer to like elements. Hereinafter, substantially the same descriptions as set forth above with reference to the embodiments of FIGS. 1A to 3 will be omitted for brevity.

Referring to FIGS. 4 and 5, a cell device isolation layer 110 according to some embodiments of the inventive concept may include a first insulating layer 112, a cell shielding layer 114, and a second insulating layer 116 and further include a third insulating layer 118.

The sum of a thickness of the second insulating layer 116 and a thickness of the first insulating layer 112 may be greater than half of a first width P1 and less than half of a second width P2.

The third insulating layer 118 may be disposed between a plurality of cell active regions 104, which are spaced apart from each other by the second width P2 in a second direction. The third insulating layer 118 may be formed on the second insulating layer 116. Side surfaces and a bottom surface of the third insulating layer 118 may be at least partially surrounded by the second insulating layer 116. In some embodiments, the third insulating layer 118 may be formed of a similar or the same material as the gap-fill insulating layer 128. In some embodiments, the third insulating layer 118 may be formed of oxide.

The peripheral device isolation layer 120 may include a first insulating liner 122, a peripheral shielding layer 124, a second insulating liner 126, and a gap-fill insulating layer 128. In some embodiments of the inventive concept, the sum of a thickness of the first insulating liner 122 and a thickness of the second insulating liner 126 may be greater than half of the first width P1 and less than half of the second width P2.

Figure 6:
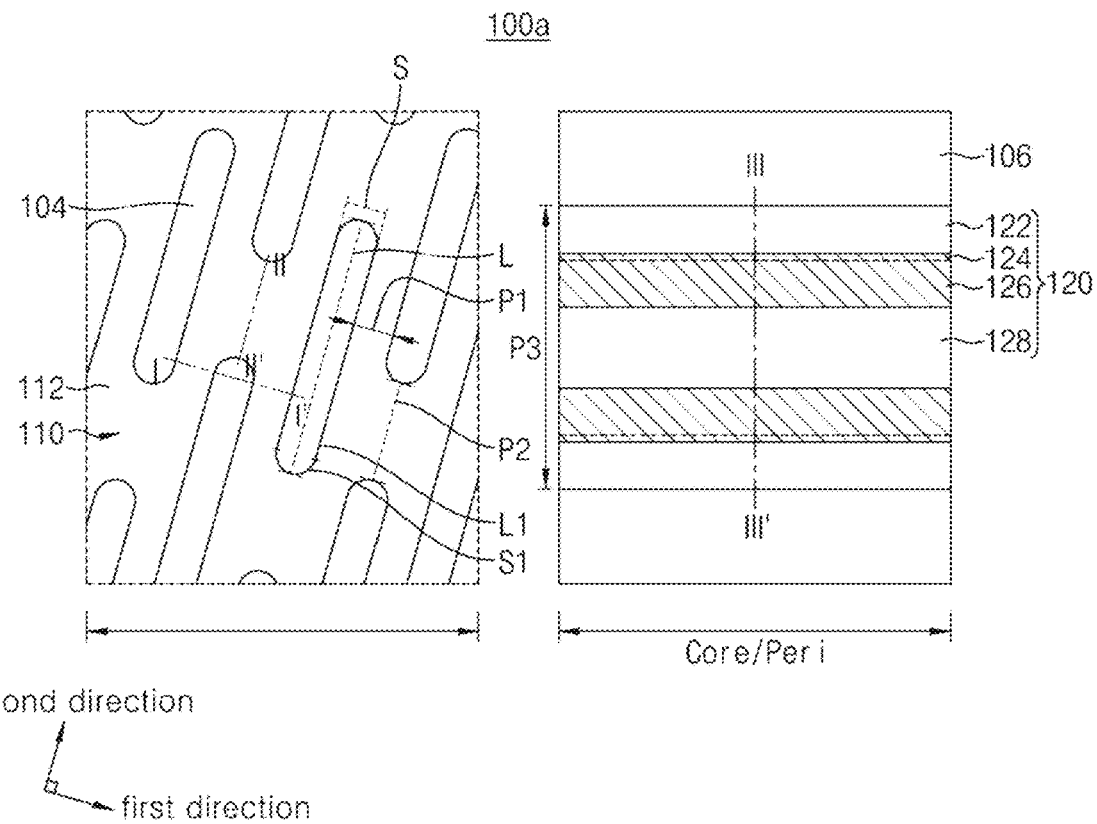
FIG. 6 is a plan view of some components of a semiconductor device according to further embodiments of the inventive concept.
Figure 7:
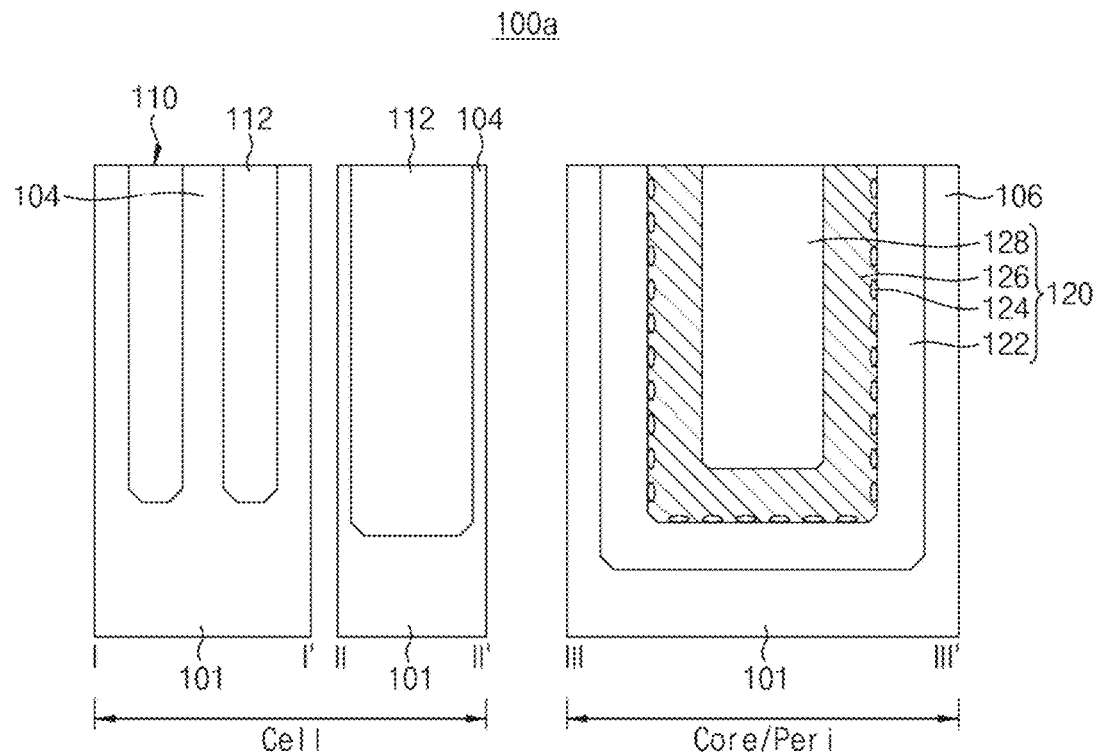
FIG. 7 shows cross-sectional views taken along lines I-I', II-II', and III-III' of FIG. 6.

FIG. 6 is a plan view of some components of a semiconductor device according to some embodiments of the inventive concept. FIG. 7 shows cross-sectional views taken along lines I-I', II-II', and III-III' of FIG. 6. In FIGS. 1A to 7, like reference numerals refer to like elements. Hereinafter, substantially the same descriptions as set forth above with reference to the embodiments of FIGS. 1A to 5 will be omitted for brevity.

Referring to FIGS. 6 and 7, the semiconductor device according to some embodiments of the inventive concept may include a cell device isolation layer 110 in a cell region and a peripheral device isolation layer 120 in a peripheral region. The cell device isolation layer 110 may define a cell active region 104, and the peripheral device isolation layer 120 may define a peripheral active region 106.

In some embodiments, the cell device isolation layer 110 may include a first insulating layer 112. The first insulating layer 112 may be in contact with sidewalls of a plurality of cell active regions 104 between the plurality of cell active regions 104. In some embodiments of the inventive concept, the first insulating layer 112 may be in contact with long sidewalls L1 of the cell active region 104 and continuously extend in a second direction. The first insulating layer 112 may be in contact with short sidewalls S1 of the cell active region 104 and continuously extend in the second direction. The first insulating layer 112 may be disposed in the spaces between the plurality of cell active regions 104 so as to partially or completely fill spaces between the plurality of cell active regions 104.

FIGS. 6 and 7 illustrate an example in which the cell device isolation layer 110 includes only the first insulating layer 112. However, embodiments of the inventive concept are not limited thereto, and the cell device isolation layer 110 may include the first insulating layer 112 and other elements in accordance with various embodiments of the inventive concept. For example, the cell device isolation layer 110 may include void regions formed inside and/or around the first insulating layer 112.

The peripheral device isolation layer 120 may include a first insulating liner 122, a peripheral shielding layer 124, a second insulating liner 126, and a gap-fill insulating layer 128. In some embodiments of the inventive concept, a thickness of the first insulating liner 122 may be equal to or greater than half of a second width P2, which corresponds to a separation distance between the cell active regions 104 in the second direction when viewed in a plan view of the semiconductor device.

Figure 8:
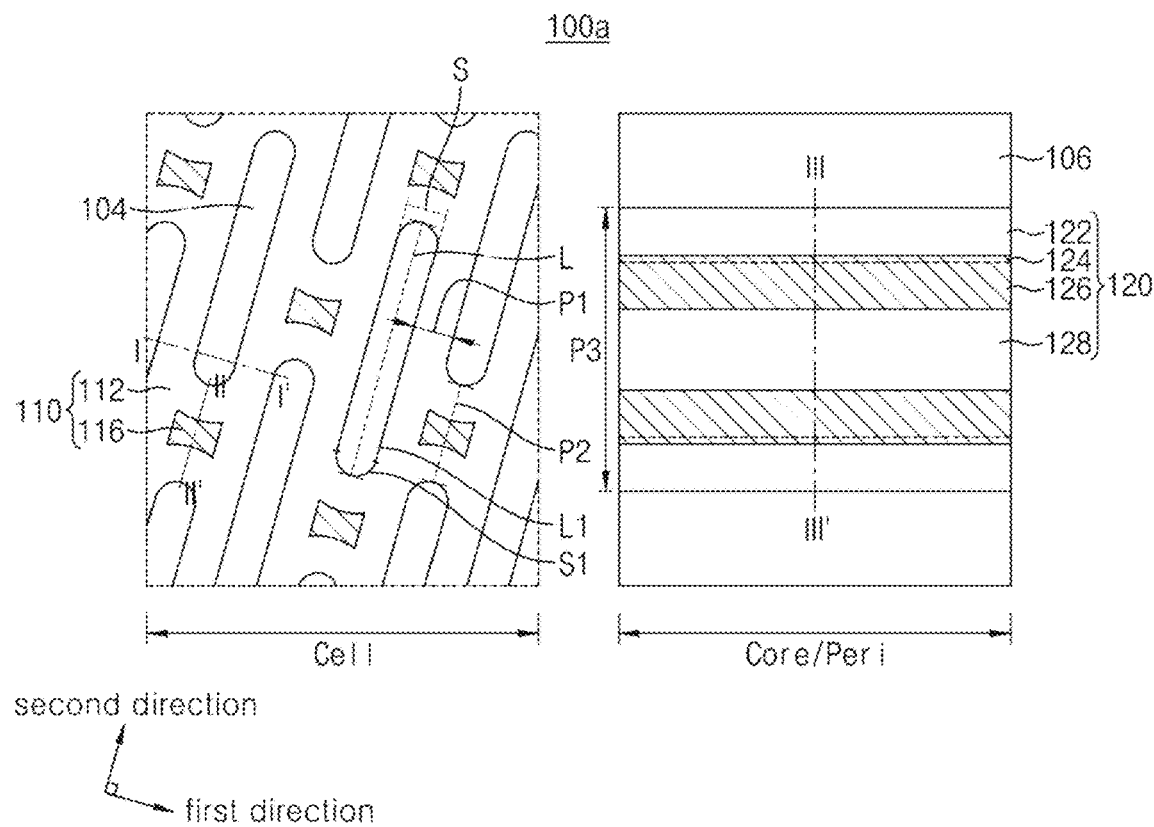
FIG. 8 is a plan view of some components of a semiconductor device according to some embodiments of the inventive concept.
Figure 9:
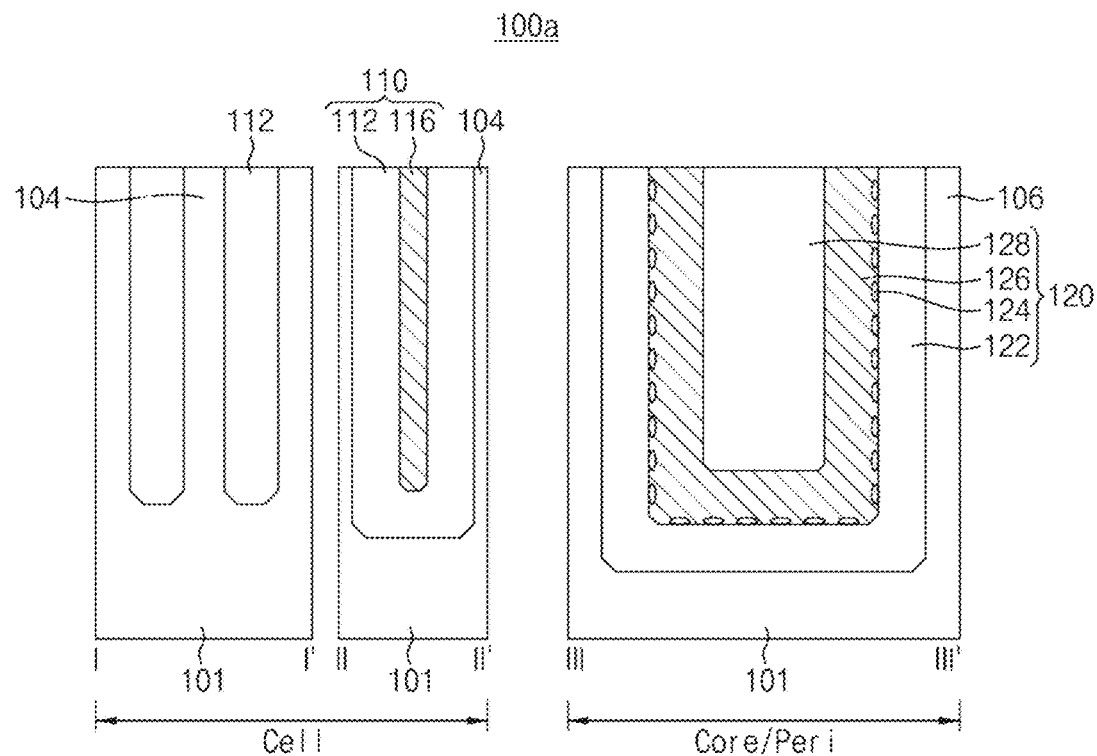
FIG. 9 shows cross-sectional views taken along lines I-I', II-II', and III-III' of FIG. 8.

FIG. 8 is a plan view of some components of a semiconductor device according to some embodiments of the inventive concept. FIG. 9 shows cross-sectional views taken along lines I-I', II-II', and III-III' of FIG. 8. In FIGS. 1A to 8, like reference numerals refer to like elements. Hereinafter, substantially the same descriptions as set forth above with reference to the embodiments of FIGS. 1A to 7 will be omitted for brevity.

Referring to FIGS. 8 and 9, a cell device isolation layer 110 may include a first insulating layer 112 and a second insulating layer 116.

The first insulating layer 112 may be formed between a plurality of cell active regions 104, which are spaced apart from each other, and in contact with sidewalls of the plurality of cell active regions 104. The first insulating layer 112 may continuously extend without a break in a first direction and a second direction. A thickness of the first insulating layer 112 may be greater than half of a first width P1 (corresponding to length between geometric centers of adjacent cell active regions 104 in the first direction when viewed in a plan view of the semiconductor device) and less than half of a second width P2 (corresponding to a separation distance between adjacent cell active regions 104 in the second direction when viewed in a plan view of the semiconductor device). The first insulating layer 112 may form a recess between the cell active regions 104 that are spaced apart from each other in the second direction.

The second insulating layer 116 may be disposed between the plurality of cell active regions 104, which are spaced apart from each other in a straight line in the second direction. The second insulating layer 116 may be disposed on the first insulating layer 112. Side surfaces and a bottom surface of the second insulating layer 116 may be at least partially surrounded by the first insulating layer 112. The second insulating layer 116 may be disposed in a recess having the first insulating layer 112 as sidewalls so as to partially or substantially completely fill the recess having the first insulating layer 112 as sidewalls.

A peripheral device isolation layer 120 may include a first insulating liner 122, a peripheral shielding layer 124, a second insulating liner 126, and a gap-fill insulating layer 128. A thickness of the first insulating liner 122 may be greater than half of the first width P1 and less than half of the second width P2. The sum of the thickness of the first insulating liner 122 and a thickness of the second insulating liner 126 may be greater than half of the second width P2 and less than half of a third width P3.

Figure 10:
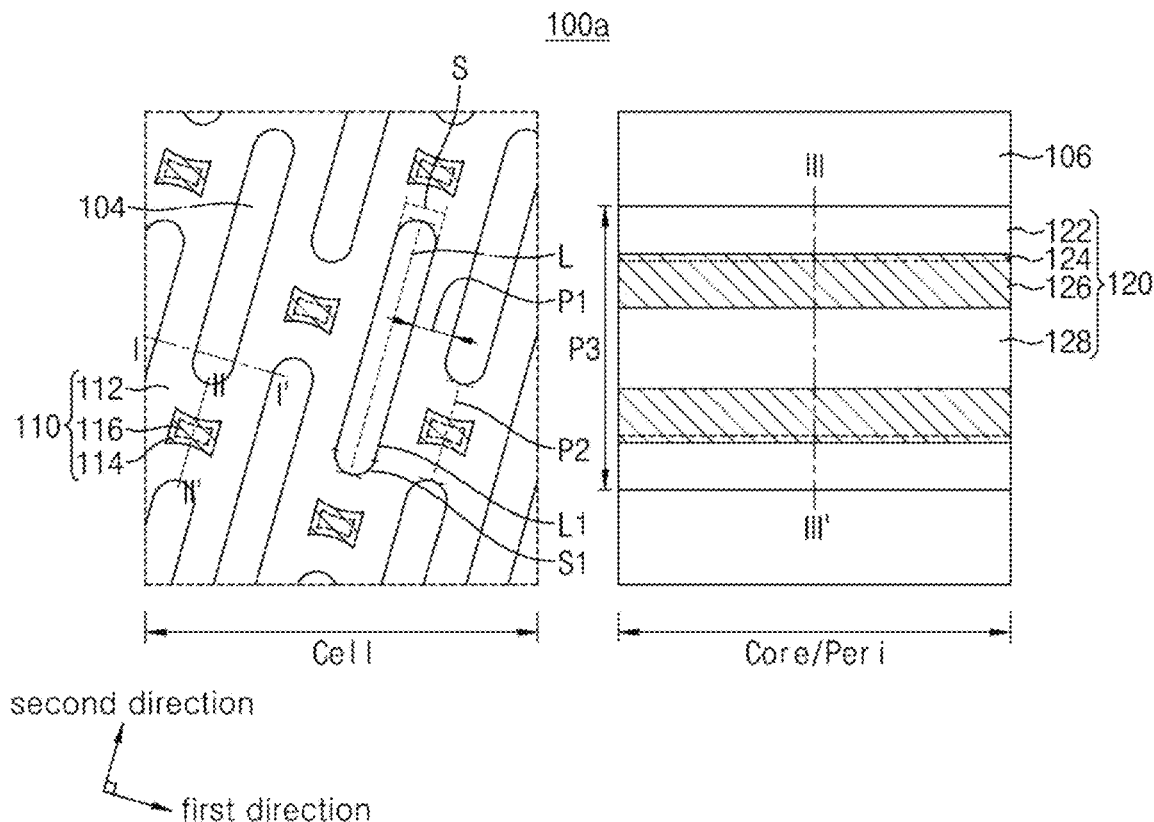
FIG. 10 is a plan view of some components of a semiconductor device according to further embodiments of the inventive concept.
Figure 11:
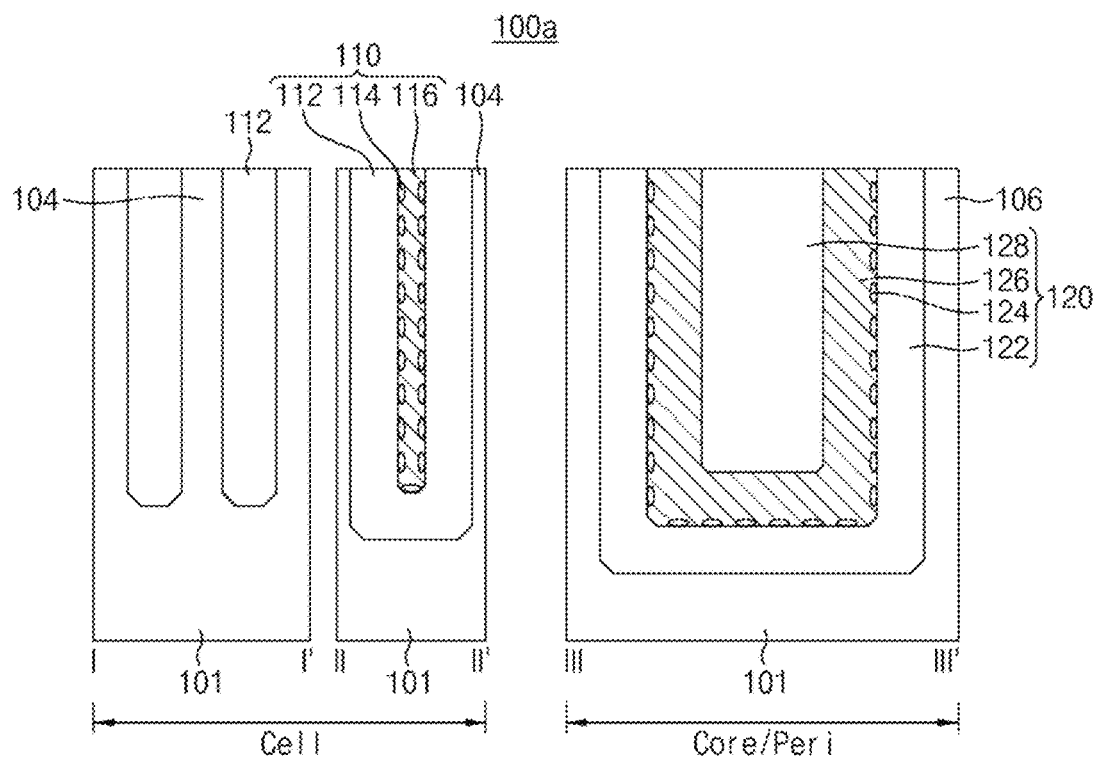
FIG. 11 shows cross-sectional views taken along lines I-I', II-II', and III-III' of FIG. 10.

FIG. 10 is a plan view of some components of a semiconductor device according to some embodiments of the inventive concept. FIG. 11 shows cross-sectional views taken along lines I-I', II-II', and III-III' of FIG. 10. In FIGS. 1A to 10, like reference numerals refer to like elements. Hereinafter, substantially the same descriptions as set forth above with reference to the embodiments of FIGS. 1A to 9 will be omitted for brevity.

Referring to FIGS. 10 and 11, a cell device isolation layer 110 may include a first insulating layer 112, a cell shielding layer 114, and a second insulating layer 116. A peripheral device isolation layer 120 may include a first insulating liner 122, a peripheral shielding layer 124, a second insulating liner 126, and a gap-fill insulating layer 128.

The first insulating layer 112 may be formed between a plurality of cell active regions 104, which are spaced apart from each other, and in contact with sidewalls of the plurality of cell active regions 104. The first insulating layer 112 may continuously extend without a break in a first direction and a second direction. A thickness of the first insulating layer 112 may be greater than half of a first width P1 (corresponding to length between geometric centers of adjacent cell active regions 104 in the first direction when viewed in a plan view of the semiconductor device) and less than half of a second width P2 (corresponding to a separation distance between adjacent cell active regions 104 in the second direction when viewed in a plan view of the semiconductor device). The first insulating layer 112 may define a recess between the plurality of cell active regions 104, which are spaced apart from each other in the second direction.

The cell shielding layer 114 may include a plurality of particles. The plurality of particles may be disposed on the first insulating layer 112 and disposed in a recess having the first insulating layer 112 as sidewalls. In some embodiments of the inventive concept, although the plurality of particles are not disposed between the cell active regions 104 which are spaced apart from each other by the first width P1, the plurality of particles may be disposed between the cell active regions 104, which are spaced apart from each other by the second width P2.

The second insulating layer 116 may be disposed between the plurality of cell active regions 104, which are spaced apart from each other in a straight line in the second direction. The second insulating layer 116 may be disposed on the first insulating layer 112. The second insulating layer 116 may at least partially cover the particles of the cell shielding layer 114 and be in contact with a surface of the first insulating layer 112, which is exposed between the particles. The second insulating layer 116 may at least partially cover both an inner wall of the first insulating layer 112 and the cell shielding layer 114. The second insulating layer 116 may be disposed in a recess having the first insulating layer 112 as sidewalls so as to partially or substantially completely fill the recess having the first insulating layer 112 as sidewalls. Side surfaces and a bottom surface of the second insulating layer 116 may be at least partially surrounded by the first insulating layer 112.

Figure 12:
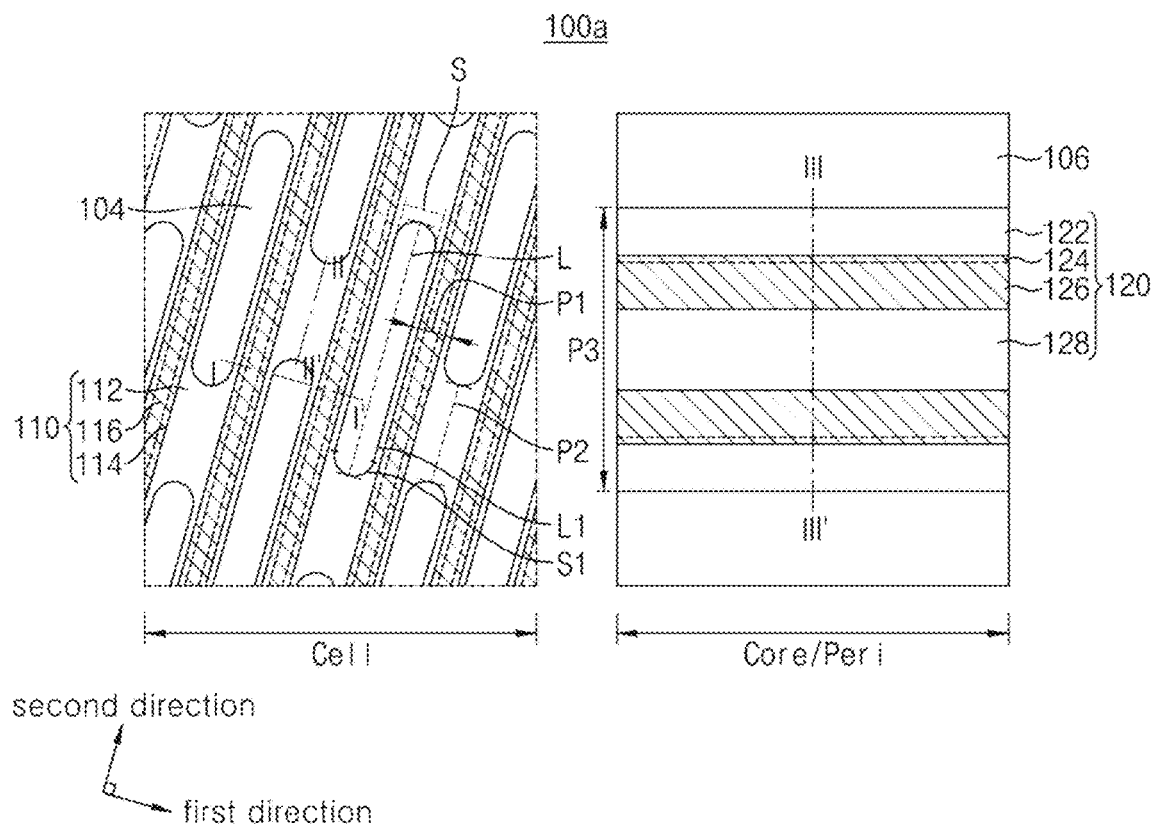
FIG. 12 is a plan view of some components of a semiconductor device according to further embodiments of the inventive concept.
Figure 13:
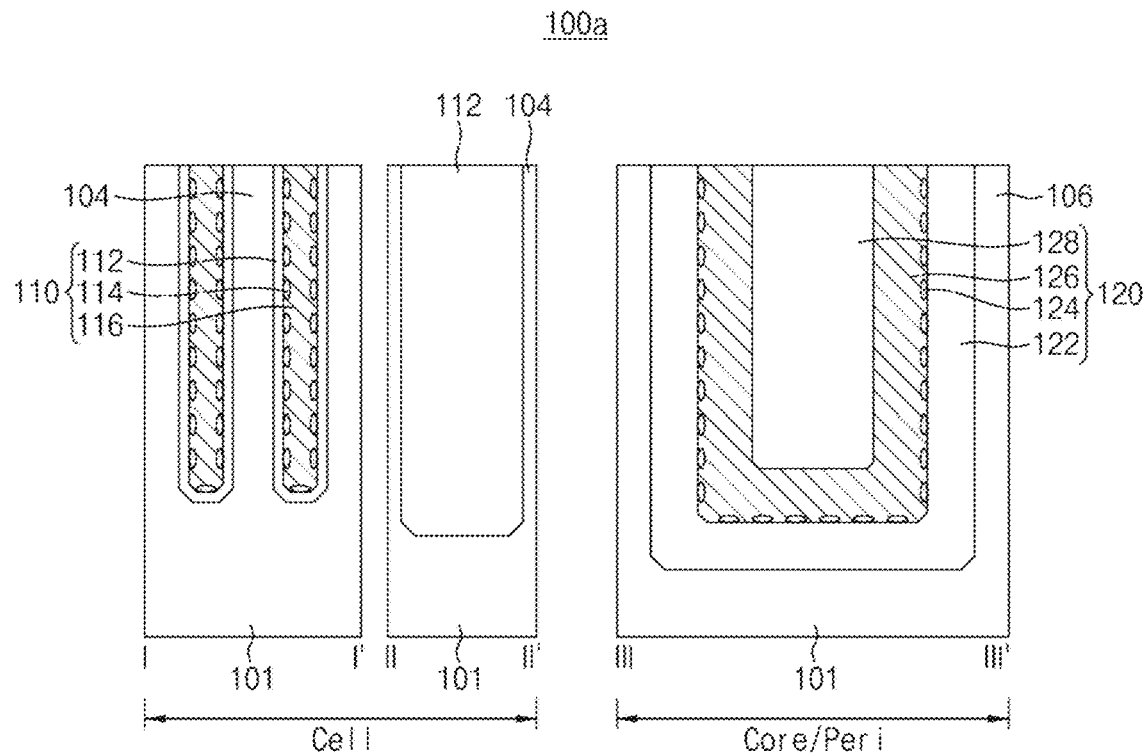
FIG. 13 shows cross-sectional views taken along lines I-I', II-II', and III-III' of FIG. 12.

FIG. 12 is a plan view of some components of a semiconductor device according to some embodiments of the inventive concept. FIG. 13 shows cross-sectional views taken along lines I-I', II-II', and III-III' of FIG. 12. In FIGS. 1A to 13, like reference numerals refer to like elements. Hereinafter, substantially the same descriptions as set forth above with reference to the embodiments of FIGS. 1A to 10 will be omitted for brevity.

Referring to FIGS. 12 and 13, a cell device isolation layer 110 may include a first insulating layer 112, a cell shielding layer 114, and a second insulating layer 116. The peripheral device isolation layer 120 may include a first insulating liner 122, a peripheral shielding layer 124, a second insulating liner 126, and a gap-fill insulating layer 128.

The first insulating layer 112 may be elongated in a second direction. When viewed from above in a plan view of the semiconductor device, the first insulating layer 112 may extend parallel to long sidewalls L1 of cell active regions 104, and a plurality of first insulating layers 112 may be spaced apart from each other in a first direction.

The first insulating layer 112 may at least partially surround the cell active region 104. The first insulating layer 112 may be in contact with short sidewalls S1 of the cell active regions 104, which are disposed adjacent to each other in the second direction, and may be disposed in a space between the cell active regions 104 so as to partially or substantially completely fill the space between the cell active regions 104 that are spaced apart from each other by a second width P2 (corresponding to a separation distance between adjacent cell active regions 104 in the second direction when viewed in a plan view of the semiconductor device). The first insulating layer 112 may be in contact with the long sidewalls L1 of the cell active regions 104 and continuously extend without a break in the second direction. A thickness of a portion of the first insulating layer 112, which is in contact with the short sidewall S1, may be greater than or equal to half of the second width P2. A thickness of a portion of the first insulating layer 112, which is in contact with the long sidewall L1, may be less than half of the first width P1 (corresponding to length between geometric centers of adjacent cell active regions 104 in the first direction when viewed in a plan view of the semiconductor device). The first insulating layer 112 may define a trench, which may be elongated in the second direction between the cell active regions 104 that are spaced apart from each other in the first direction.

The cell shielding layer 114 may be disposed between the cell active regions 104, which are spaced apart from each other in the first direction, and may not be disposed between the cell active regions 104, which are spaced apart from each other in the second direction. The cell shielding layer 114 may include a plurality of particles. The plurality of particles may be disposed on sidewalls and/or a bottom surface of the first insulating layer 112. A plurality of particles, which are disposed on one sidewall of the first insulating layer 112 elongated in the second direction, may be spaced apart from each other in the second direction when viewed from above in a plan view of the semiconductor device. The plurality of particles may be disposed in a straight line in the second direction when viewed from above in a plan view of the semiconductor device.

A thickness of the first insulating liner 122 may be greater than half of the second width P2. The first insulating liner 122 may be formed simultaneously or in concert with the portion of the first insulating layer 112, which is in contact with the short sidewall S1 of the cell active region 104. The first insulating liner 122 may be formed during a different process operation from the portion of the first insulating layer 112, which is in contact with the long sidewall L1 of the cell active region 104.

Figure 14:
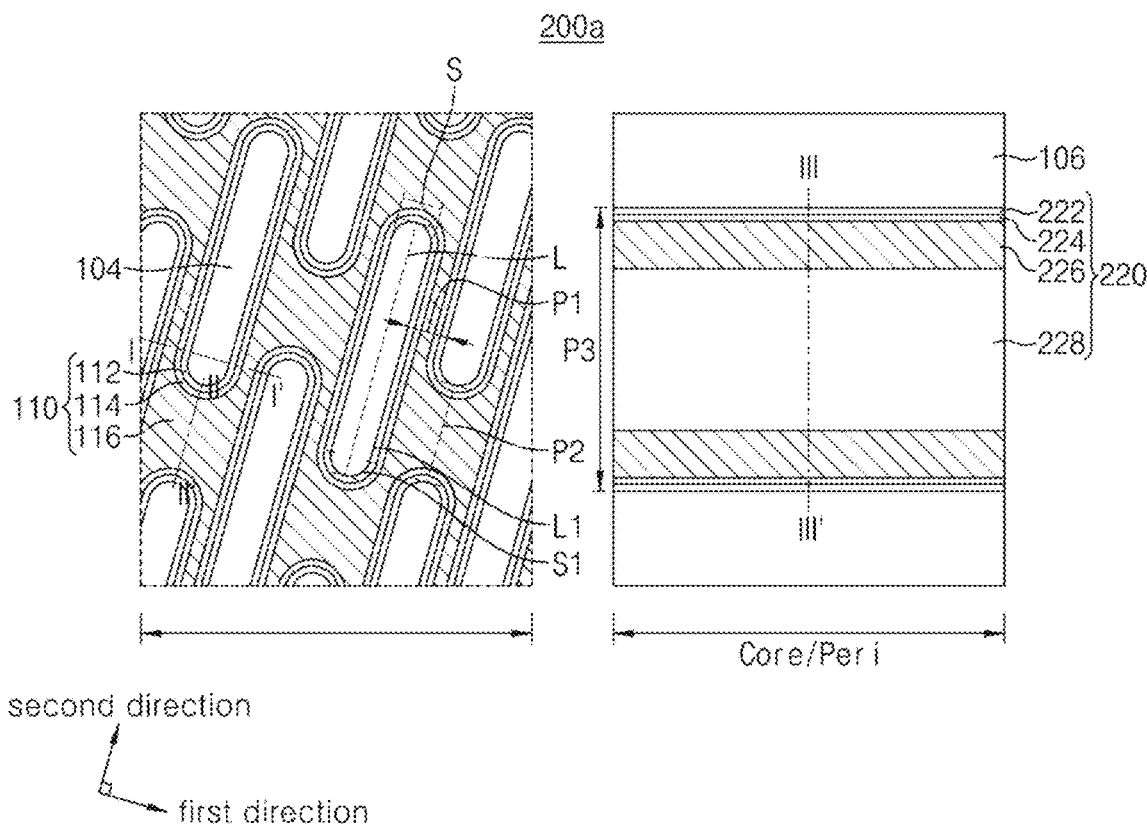
FIGS. 14, 16, and 18 are plan views of some components of semiconductor devices according to further embodiments of the inventive concept.
Figure 15:
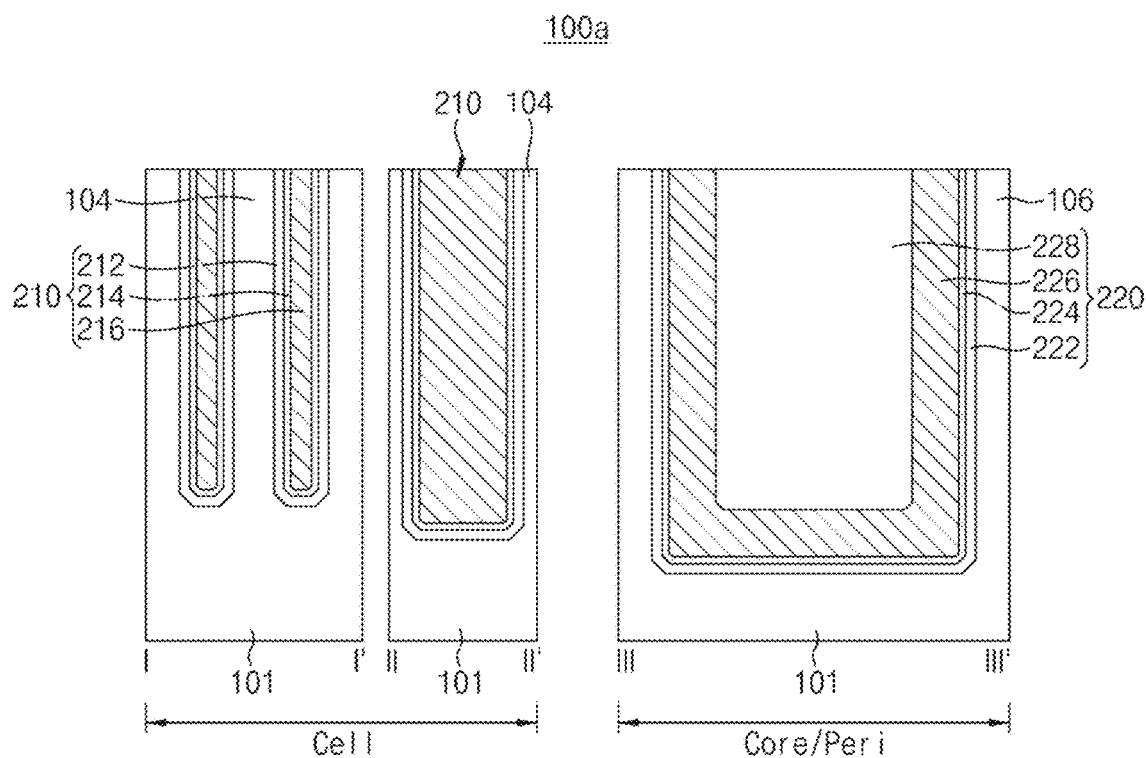
FIGS. 15, 17, and 19 shows cross-sectional views taken along lines I-I', and of FIGS. 14, 16, and 18, respectively.
Figure 16:
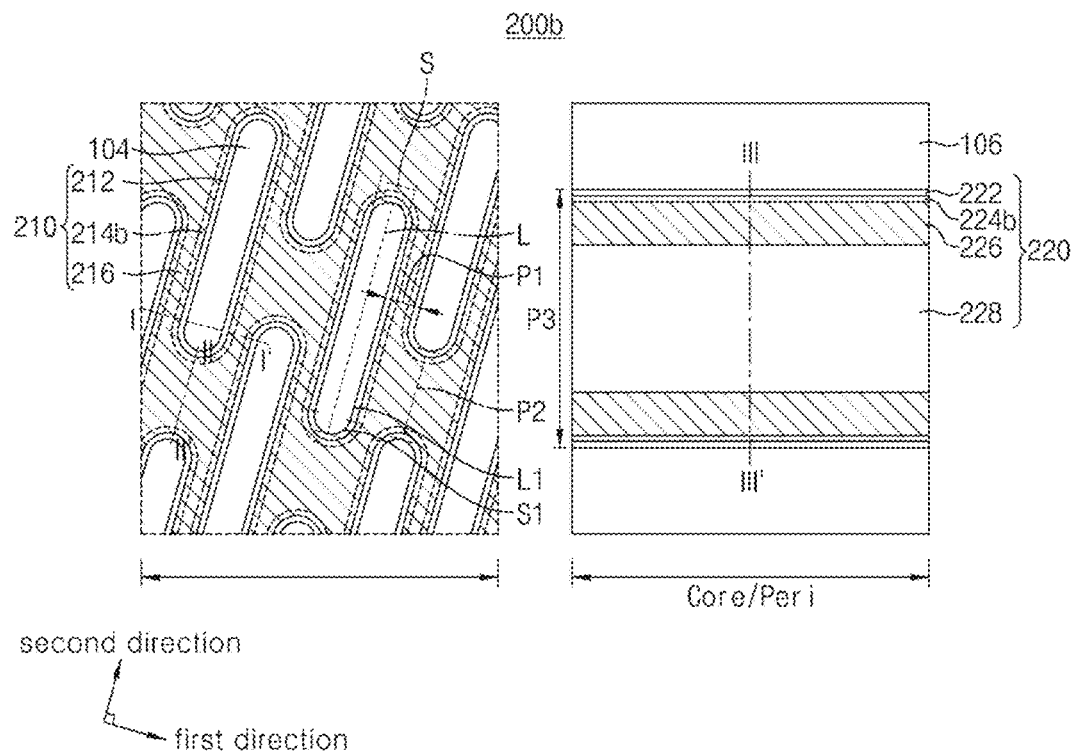
Figure 17:
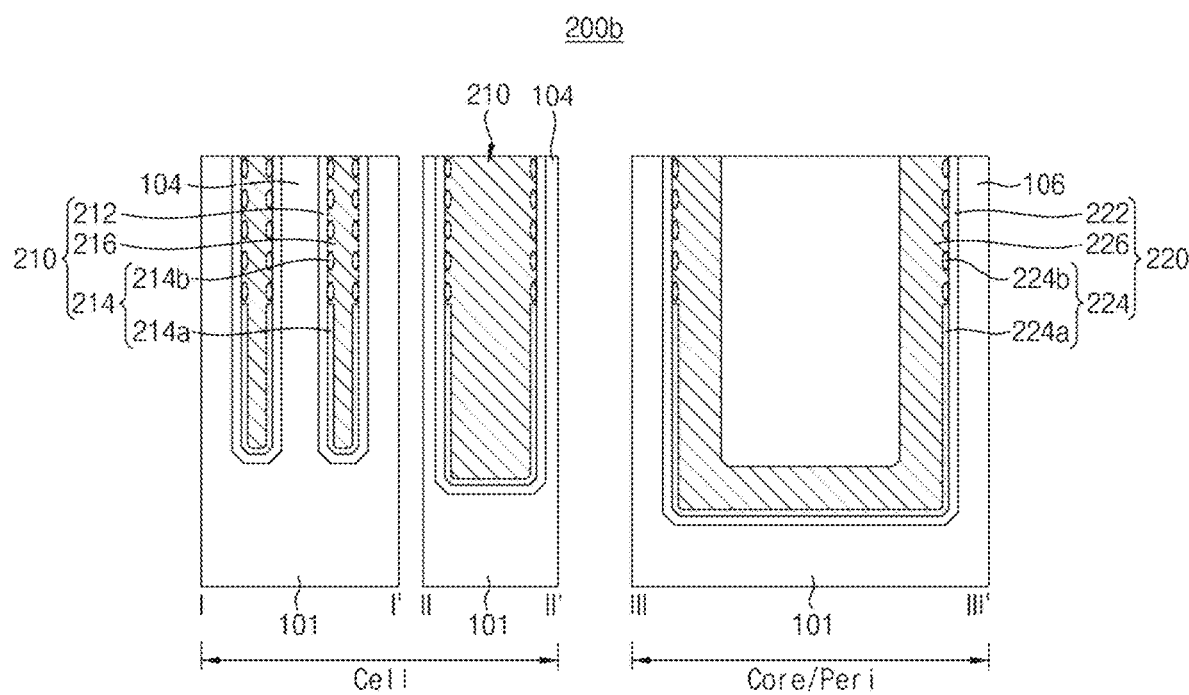
Figure 18:
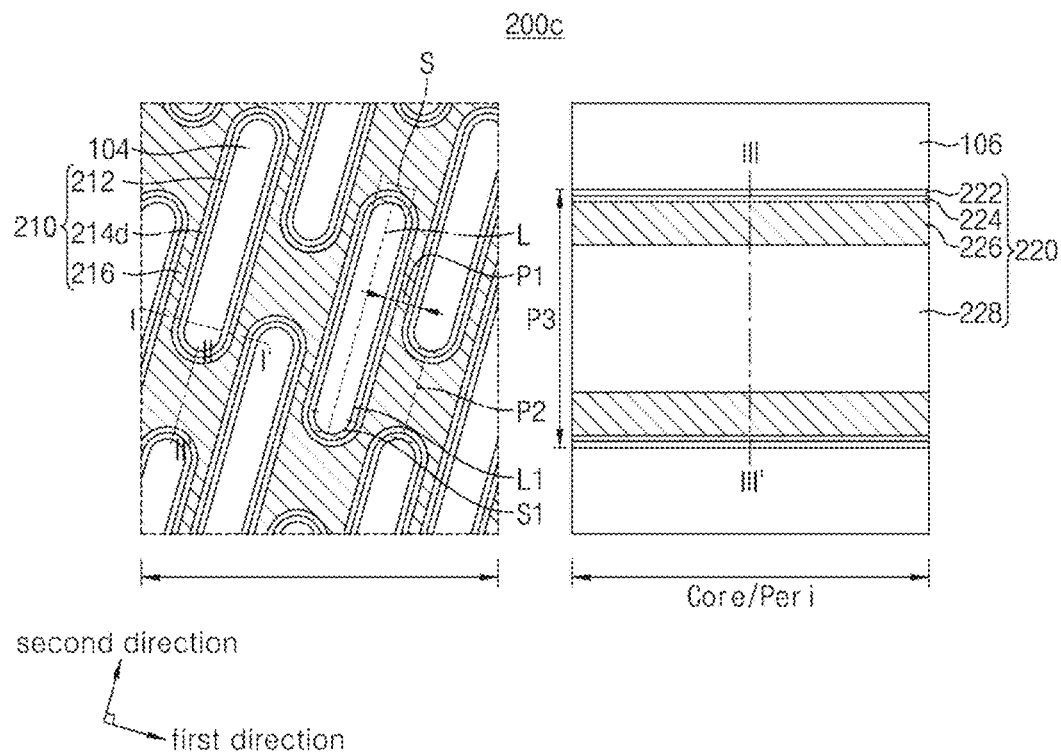
Figure 19:
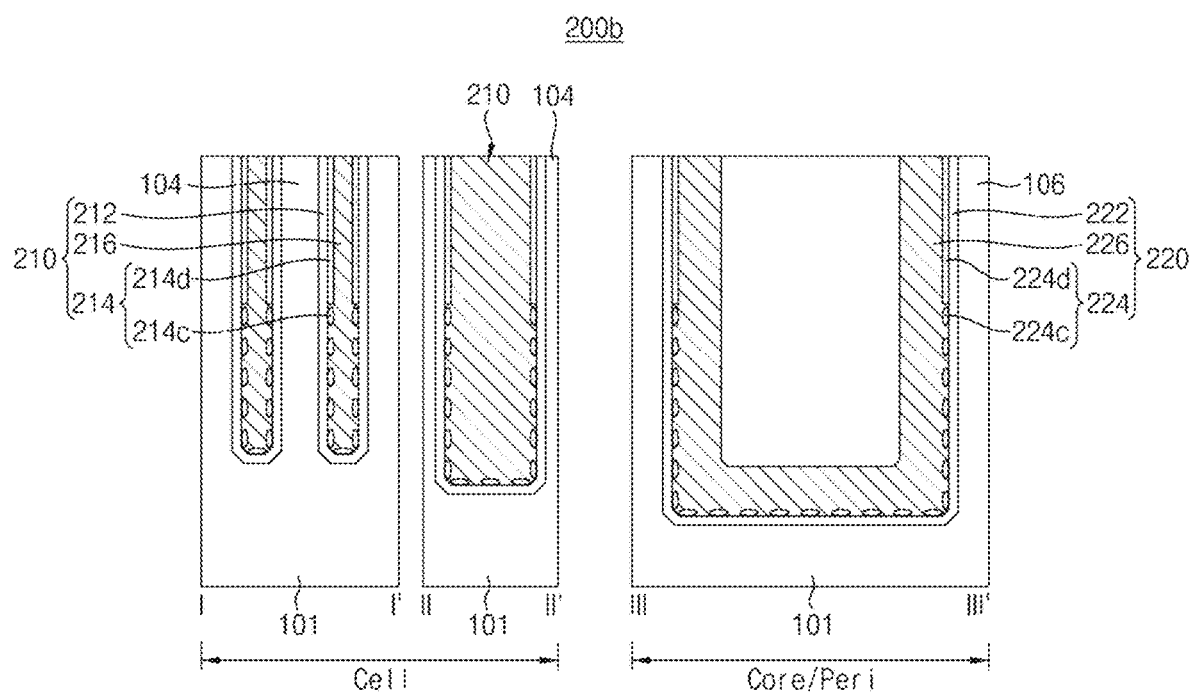

FIGS. 14, 16, and 18 are plan views of some components of semiconductor devices according to some embodiments of the inventive concept. FIGS. 15, 17, and 19 shows cross-sectional views taken along lines I-I', II-II', and III-III' of FIGS. 14, 16, and 18, respectively. In FIGS. 1A to 18, like reference numerals refer to like elements. Hereinafter, substantially the same descriptions as set forth above with reference to the embodiments of FIGS. 1A to 13 will be omitted for brevity.

Referring to FIGS. 14 and 15, a cell device isolation layer 210 may include a first insulating layer 212, a cell shielding layer 214, and a second insulating layer 216. The peripheral device isolation layer 220 may include a first insulating liner 222, a peripheral shielding layer 224, and a second insulating liner 226.

The cell shielding layer 214 may be disposed on the first insulating layer 212. The cell shielding layer 214 may be a liner layer 214a, which is formed along side surfaces and a bottom surface of the first insulating layer 212. The liner layer 214a may extend from the bottom surface of the first insulating layer 212 to the side surfaces thereof. The cell shielding layer 214 may include, for example, one or more materials including, but not limited to, polysilicon doped with impurities, tungsten, or titanium nitride.

The second insulating layer 216 may be disposed on the cell shielding layer 214, and side surfaces and a bottom surface of the second insulating layer 216 may be at least partially surrounded by the cell shielding layer 214. In some embodiments of the inventive concept, the second insulating layer 216 may continuously extend in a first direction and a second direction. The second insulating layer 216 may be disposed in a remaining space, which is left after the first insulating layer 212 and the cell shielding layer 214 are formed between the cell active regions 104 so as to partially fill or fill the remaining space, which is left after the first insulating layer 212 and the cell shielding layer 214 are formed between cell active regions 104. For example, the second insulating layer 216 may be formed of nitride.

The peripheral shielding layer 224 may be disposed on the first insulating liner 222. The peripheral shielding layer 224 may be or correspond to the liner layer 214a, which is formed along side surfaces and a bottom surface (relative to the semiconductor substrate 101 being a bottom reference point on which other structures are formed) of the first insulating liner 222. The liner layer 214a may extend from the bottom surface of the first insulating liner 222 to the side surfaces thereof. The peripheral shielding layer 224 may include, for example, one or more materials including, but not limited to, polysilicon doped with impurities, tungsten, or titanium nitride.

The second insulating liner 226 may be disposed on the peripheral shielding layer 224. A gap-fill insulating layer 228 may be disposed on the second insulating liner 226 and may be disposed in a remaining space, which is left after the first insulating liner 222, the peripheral shielding layer 224, and the second insulating liner 226 are formed between peripheral active regions 106 so as to partially fill or fill the remaining space, which is left after the first insulating liner 222, the peripheral shielding layer 224, and the second insulating liner 226 are formed between peripheral active regions 106.

Referring to FIGS. 16 and 17, the cell shielding layer 214 may include a liner layer 214a and a plurality of particles 214b. The liner layer 214a may extend along side surfaces and a bottom surface (relative to the semiconductor substrate 101 as described above) of the first insulating layer 212. The liner layer 214a may at least partially cover lower side surfaces of the first insulating layer 212 and may not cover or may expose upper side surfaces of the first insulating layer 212. A top end of the liner layer 214a may be formed at a lower level than a top surface of a semiconductor substrate and be spaced apart from the top surface of the semiconductor substrate by a predetermined depth. When the predetermined depth is excessively small, a device defect may easily occur due to contact of a conductive structure with the liner layer 214a. Thus, the predetermined depth may be appropriately controlled to reduce defects based on characteristics of the semiconductor device.

The plurality of particles 214b may be disposed on the first insulating layer 212 and be spaced apart from the liner layer 214a. The plurality of particles 214b may be in contact with the upper side surfaces of the first insulating layer 212 on which the liner layer 214a is not formed. The plurality of particles 214b may be disposed apart from each other.

The liner layer 214a and the plurality of particles 214b may be formed of a conductive material. For example, the liner layer 214a and the plurality of particles 214b may include one or more materials including, but not limited to, polysilicon doped with impurities, tungsten, or titanium nitride. The liner layer 214a and the plurality of particles 214b may be formed of the same element or material.

The peripheral shielding layer 224 may have a similar or the same configuration as the cell shielding layer 214. For example, the peripheral shielding layer 224 may include a liner layer 224a, which may at least partially cover a sidewall and a bottom surface (relative to the semiconductor substrate 101 as described above) of the first insulating liner 222, and a plurality of particles 224b, which are disposed on the first insulating liner 222 and spaced apart from the liner layer 224a.

Referring to FIGS. 18 and 19, in a cell region Cell, a plurality of particles 214c may be spaced apart from each other and disposed on side surfaces and a bottom surface (relative to the semiconductor substrate 101 as described above) of the first insulating layer 212. The plurality of particles 214c may be disposed only on lower side surfaces of the first insulating layer 212 but may not be disposed on upper side surfaces of the first insulating layer 212.

A liner layer 214d may be disposed on the first insulating layer 212 and be spaced apart from the plurality of particles 214c. The liner layer 214d may be disposed on the upper side surfaces of the first insulating layer 212 and may not be disposed on or may expose the lower side surfaces of the first insulating layer 212 on which the plurality of particles 214c are disposed. In a peripheral region Core/Peri, a plurality of particles 224c may be spaced apart from each other and disposed on a side surface and a bottom surface (relative to the semiconductor substrate 101 as described above) of a first insulating liner 222. A liner layer 224d may be spaced apart from the plurality of particles 224c and disposed on upper side surfaces of the first insulating liner 222.

Figure 20:
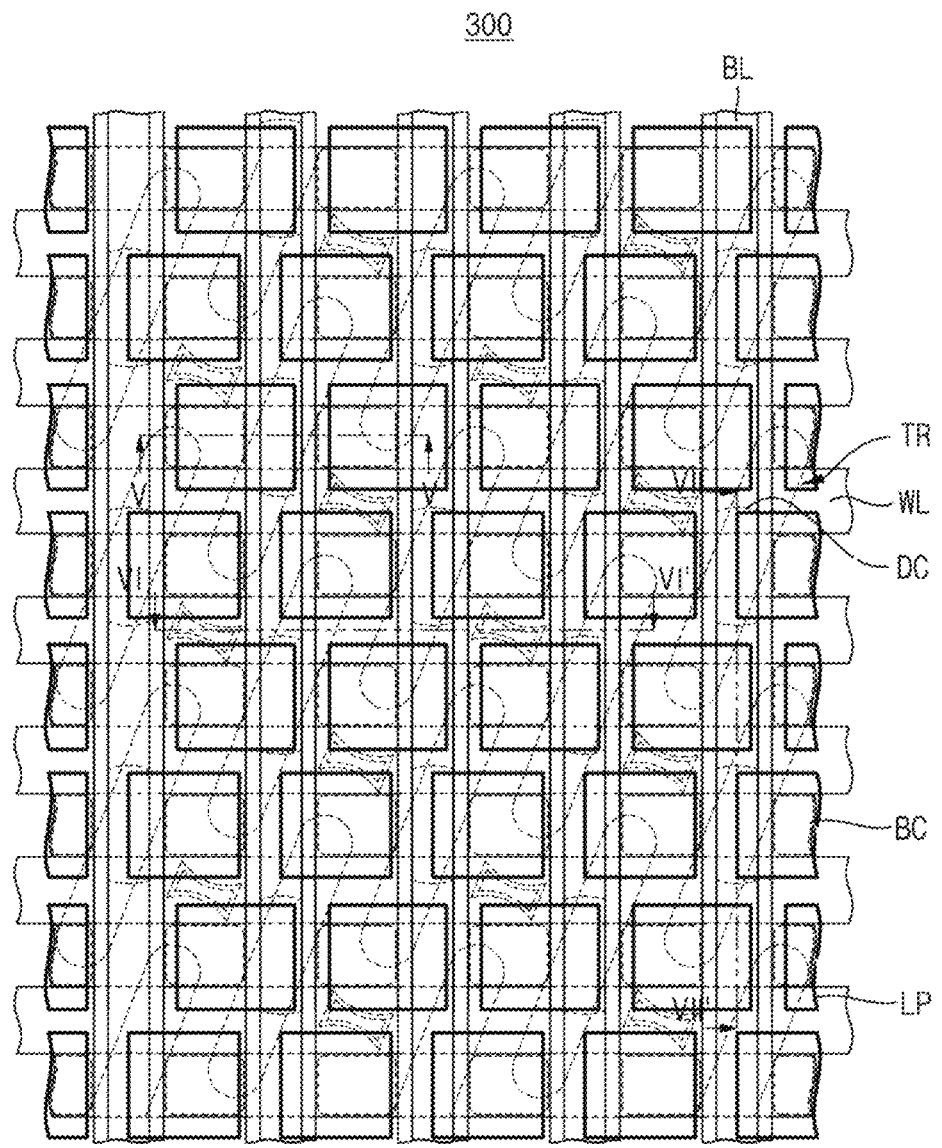
FIG. 20 shows a layout of a first region of a semiconductor device according to some embodiments of the inventive concept.
Figure 21:
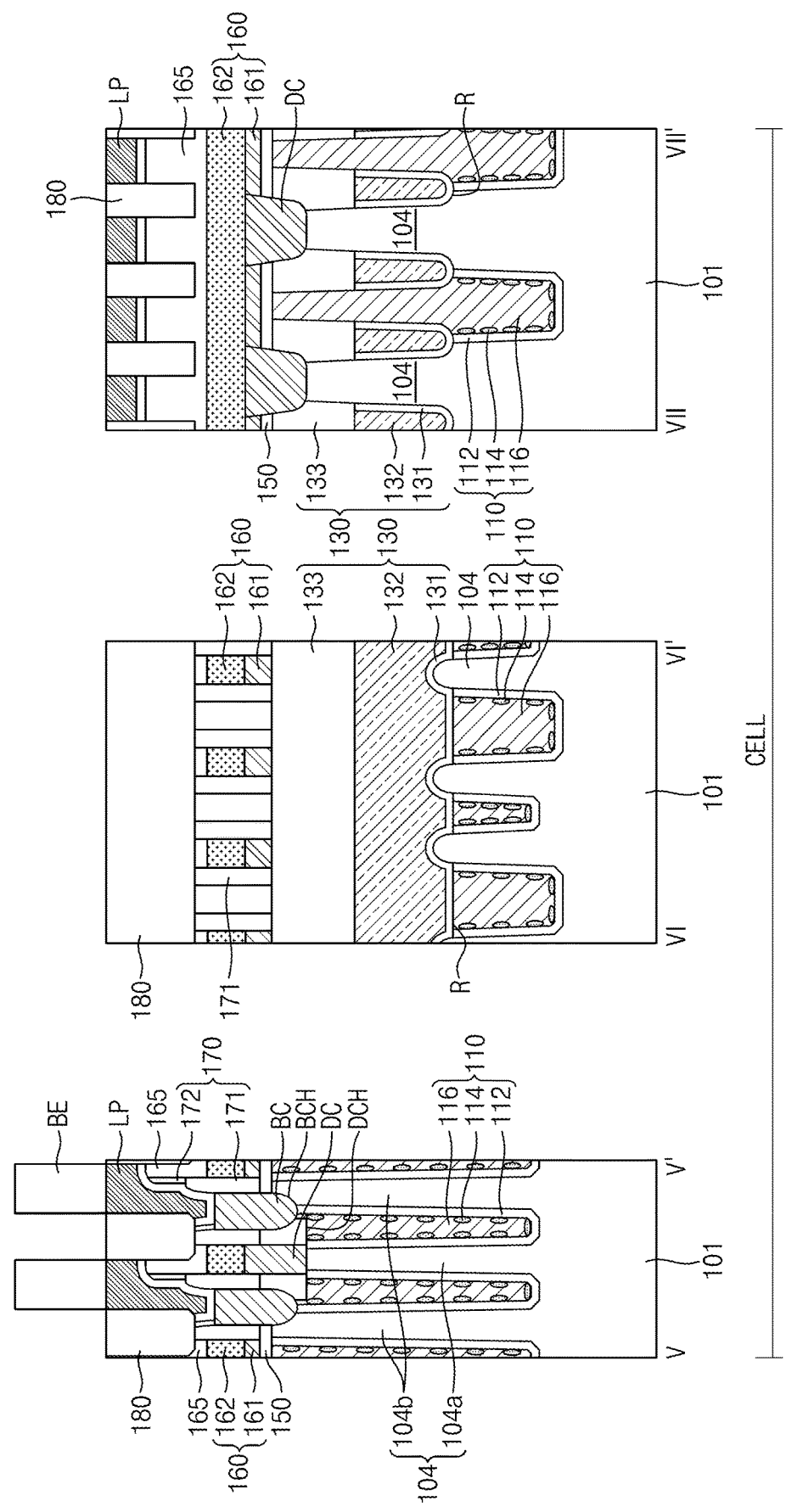
FIG. 21 shows cross-sectional views taken along lines V-V', VI-VI', and VII-VII' of FIG. 20.

FIG. 20 shows a layout of a first region of a semiconductor device according to some embodiments of the inventive concept. FIG. 21 shows cross-sectional views taken along lines V-V', VI-VI', and VII-VII' of FIG. 20. In FIGS. 1A to 21, like reference numerals refer to like elements.

Hereinafter, substantially the same descriptions as set forth above with reference to the embodiments of FIGS. 1A to 19 will be omitted for brevity.

Referring to FIGS. 20 and 21, cell active regions 104 may be defined by cell device isolation layers 110 in a first region I of the semiconductor device. The cell active regions 104 may be arranged in a zigzag configuration along an X-axis and arranged in a row along the X-axis. As described above, the cell device isolation layer 110 may include a first insulating layer 112, a cell shielding layer 114, and a second insulating layer 116.

Word lines WL may be disposed across the cell active regions 104 and extend in an X-axial direction. The word lines WL may be disposed parallel to each other in a Y-axial direction. Bit lines BL may extend on the word lines WL in the Y-axial direction and be disposed parallel to each other in the X-axial direction. The bit lines BL may be connected to the cell active regions 104 through direct contacts DC. The direct contact DC is referred to as a first contact plug DC.

Storage node contacts BC may be formed between pairs of adjacent bit lines BL of the bit lines BL. The storage node contacts BC may be arranged in a row in the X-axial direction and the Y-axial direction. The storage node contact BC may be referred to as a second contact plug BC.

Recess regions R for forming transistors TR may be formed on a substrate 101 of the semiconductor device. The recess regions R may be formed as line patterns having a generally constant width and extending in the X-axial direction. The recess regions R may be formed across the cell active regions 104 and the cell device isolation layers 110 to be parallel to each other in the X-axial direction. The recess regions R may be formed in both edge portions of the cell active regions 104.

The transistors TR may be formed in the cell active region 104. Each of the transistors TR may include a gate insulating film 131, a gate electrode 132, a gate capping film 133, a first impurity region 104a, and a second impurity region 104b. The gate insulating film 131, the gate electrode 132, and the gate capping film 133 may be collectively referred to as a gate structure. That is, the gate structure may include a gate insulating layer 131, a gate electrode 132, and a gate capping layer 133. The gate structure may correspond to a word lines (WL).

The gate insulating film 131 may be formed on an inner side surface of the recess region R. The gate insulating film 131 may be formed between the cell active region 104 and the gate electrode 132. For example, the gate insulating film 131 may include one or more materials including, but not limited to, a thermal oxide film, a silicon oxide film, a silicon oxynitride film, and a high-k material.

The gate electrode 132 may be disposed on the gate insulating film 131. The cell device isolation layer 110 and the cell active region 104 may face the gate electrode 132 with the gate insulating film 131 therebetween. A top surface of the first insulating layer 112 may be in contact with a bottom surface of the gate insulating film 131 (relative to the semiconductor substrate 101 as described above). A top surface of the second insulating layer 116 may be in contact with the bottom surface of the gate insulating film 131 (relative to the semiconductor substrate 101 as described above). The shielding layer 114 may include a plurality of particles spaced apart from each other and may not be in contact with the gate insulating film 131. However, embodiments of the inventive concept are not limited thereto, and some of the particles of the shielding layer 114 may be in contact with the gate insulating film 131.

The gate electrode 132 may be disposed in so as to partially fill or fill a lower portion of the recess region R. The gate electrode 132 may be formed of a conductive material. In some embodiments, the gate electrode 132 may form a word line.

The gate capping film 133 may be formed on the gate electrode 132 to at least partially cover the gate electrode 132. The gate capping film 133 may be disposed in so as to partially fill or fill an upper portion of the recess region R. A top surface of the gate capping film 133 may be disposed at the same level as a top surface of the cell active region 104 (relative to the semiconductor substrate 101 as described above). The gate capping film 133 may include an insulating material.

The first impurity region 104a may be disposed in the cell active region 104, which is disposed between a pair of gate electrodes 132. The second impurity region 104b may be formed in the cell active region 104, which is between a pair of gate electrodes 132. The first impurity region 104a and the second impurity region 104b may be doped with n-type impurities. The first impurity region 104a and the second impurity region 104b may serve as a source region and/or a drain region.

A buffer insulating film pattern 150 may be formed on the cell active region 104 and the cell device isolation layer 110. For example, the buffer insulating film pattern 150 may be formed of one or more materials including, but not limited to, silicon oxide, silicon nitride, or a combination thereof. The buffer insulating film pattern 150 may include a single layer or a multilayered structure.

A bit line structure may include a bit line 161 and 162 and a bit line capping pattern 165. The bit line 161 and 162 may extend in the Y-axial direction across the word line WL and be disposed parallel to each other in the X-axial direction. The bit line 161 and 162 may be connected to the cell array region 104 through a first contact plug DC.

The bit line 161 and 162 may include a conductive pattern 161 and a metal-containing layer 162. The bit line 161 and 162 may include the metal-containing layer 162 formed on the conductive pattern 161. The bit line 161 and 162 may have a multilayered stack structure including the conductive pattern 161 and the metal-containing layer 162.

For example, the conductive pattern 161 may include a polysilicon layer doped with impurities. The metal-containing layer 162 may include one or more metals, such as, but not limited to, tungsten, titanium, tantalum, or the like, or one or more conductive metal nitrides, such as, but not limited to, a nitride of tungsten, titanium, tantalum, or the like. The conductive pattern 161 and the metal-containing layer 162 are not limited to the above-described materials in accordance with various embodiments of the inventive concept.

The bit line capping pattern 165 may be formed on the bit line 161 and 162. The bit line capping pattern 165 may include the above-described insulating material.

The first contact plug DC may be disposed in so as to partially fill or fill a first contact hole DCH, which exposes a portion of the cell active region 104 and is electrically connected to the cell active region 104. The first contact hole DCH may pass through the first impurity region 104a of the cell active region 104, the cell device isolation layer 110 adjacent to the first impurity region 104a, and a portion of the gate capping film 133 so that a lower end portion of the first contact hole DCH may be disposed at a lower level than the top surface of the cell active region 104 (relative to the semiconductor substrate 101 as described above). The first contact plug DC may form the direct contact DC configured to connect the bit line 161 and 162 with the cell active region 104.

A lower end of the first contact plug DC may be insulated from the gate electrode 132 by the gate capping film 133. In some embodiments, the first contact plug DC may be formed of a conductive material.

Insulating spacers 170 may be disposed between inner side surfaces of the first contact hole DCH and the first contact plug DC. The insulating spacers 170 may include an insulating material disposed in so as to partially fill or fill the inside of the first contact hole DCH and may at least partially surround a side surface of the first contact plug DC. The insulating spacers 170 may insulate the first contact plug DC from a second contact plug BC adjacent to the first contact plug DC. For example, the insulating spacers 170 may include a plurality of stack structures that are sequentially stacked on both side surfaces of the bit line structure.

The second contact plug BC may be disposed in so as to partially fill or fill the second contact hole BCH formed between two adjacent bit lines 161 and 162. The second contact plug BC may extend to upper portions of the two adjacent bit lines 161 and 162. The second contact plug BC may form the storage node contact BC.

In some embodiments, the second contact plug BC may be disposed in so as to partially fill or fill the second contact hole BCH so that a portion of the second contact plug BC may be in contact with the device isolation layer 110. For example, the second contact plug BC may be in contact with the first insulating layer 112 and the second insulating layer 116. In contrast, because the particles of the shielding layer 114 are disposed apart from each other, the second contact plug BC may be disposed in a space between the particles and may not be in contact with the shielding layer 114. However, embodiments of the inventive concept are not limited thereto, and some of the particles of the shielding layer 114 may be in contact with the second contact plug BC.

A barrier film 175 may conformally at least partially cover the insulating spacers 170, the second contact plug BC, and the bit line capping pattern 165.

Landing pads LP may be disposed on the barrier film 175. The landing pads LP may be formed of a metal-containing material. The landing pads LP and the second contact plugs BC may serve to connect lower electrodes BE of capacitors formed on the bit lines 161 and 162 with the cell active regions 104. The landing pads LP may be disposed to at least partially overlap the second contact plugs BC.

Landing pad isolation patterns 180 may isolate the landing pads LP from each other in the X-axial direction and the Y-axial direction. The lower electrodes BE may be disposed on the landing pads LP.

Figure 22:
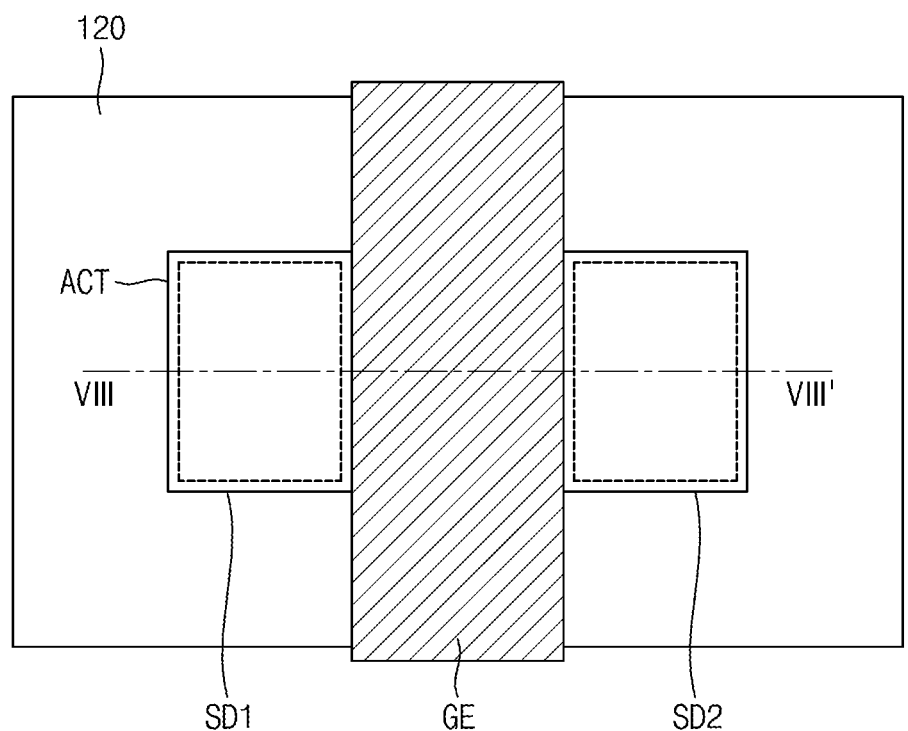
FIG. 22 is a plan view of some components of a semiconductor device according to further embodiments of the inventive concept.
Figure 23:
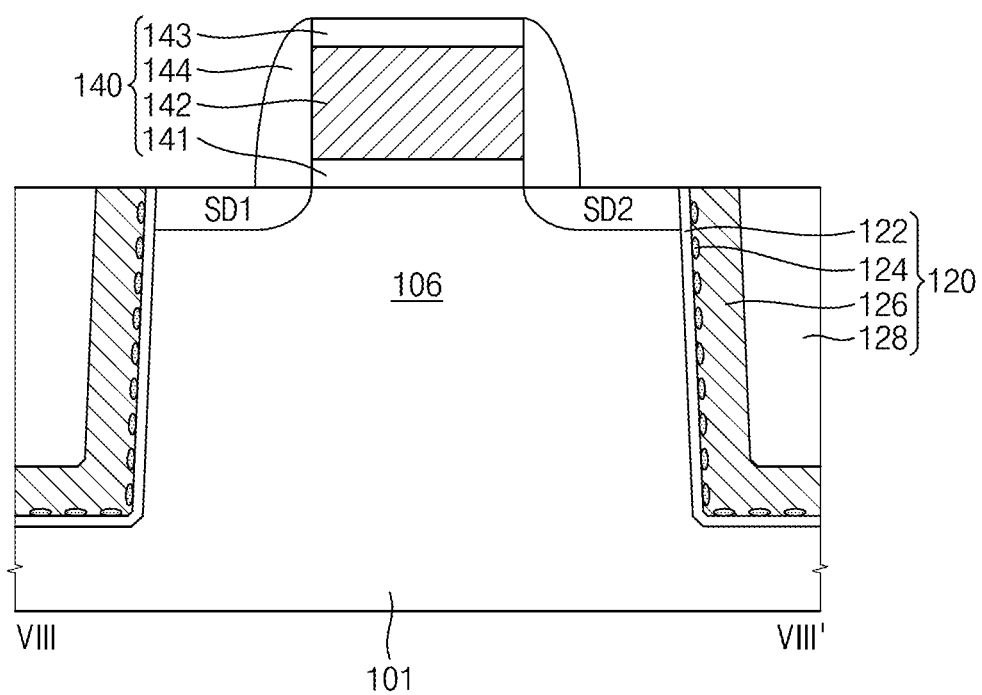
FIG. 23 is a cross-sectional view taken along a line VIII-VIII' of FIG. 22.

FIG. 22 is a plan view of some components of a semiconductor device according to some embodiments of the inventive concept. FIG. 23 is a cross-sectional view taken along a line VIII-VIII' of FIG. 22. In FIGS. 1A to 23, like reference numerals refer to like elements. Hereinafter, substantially the same descriptions as set forth above with reference to the embodiments of FIGS. 1A to 20 will be omitted for brevity.

Referring to FIGS. 22 and 23, the semiconductor device may include an active region 106, a device isolation layer 120, and a gate structure 140. The active region 106 may be defined by the device isolation layer 120. The active region 106 may include a source region, a drain region, and a channel region. The device isolation layer 120 may include a first insulating liner 122, a shielding layer 124, a second insulating liner 126, and a gap-fill insulating layer 128.

The gate structure 140 may be formed on the active region 106. The gate structure 106 may include a gate insulating layer 141, a gate electrode 142, and a gate capping layer 143. Further, the gate structure 140 may include spacers 144 disposed on both side surfaces of the gate insulating layer 141 and the gate electrode 142. A lower end of the gate structure 140 may be in contact with a device isolation layer 120. The gate structure 140 may be in contact with a first insulating liner 122 and a second insulating liner 126 and may be in contact with some of particles included in the shielding layer 124.

FIGS. 24 to 29 are diagrams illustrating a method of manufacturing a semiconductor device according to some embodiments of the inventive concept. In FIGS. 24 to 29, lines I-I', and correspond respectively to the lines I-I', II-II', and III-III' of FIG. 2.

Figure 24:
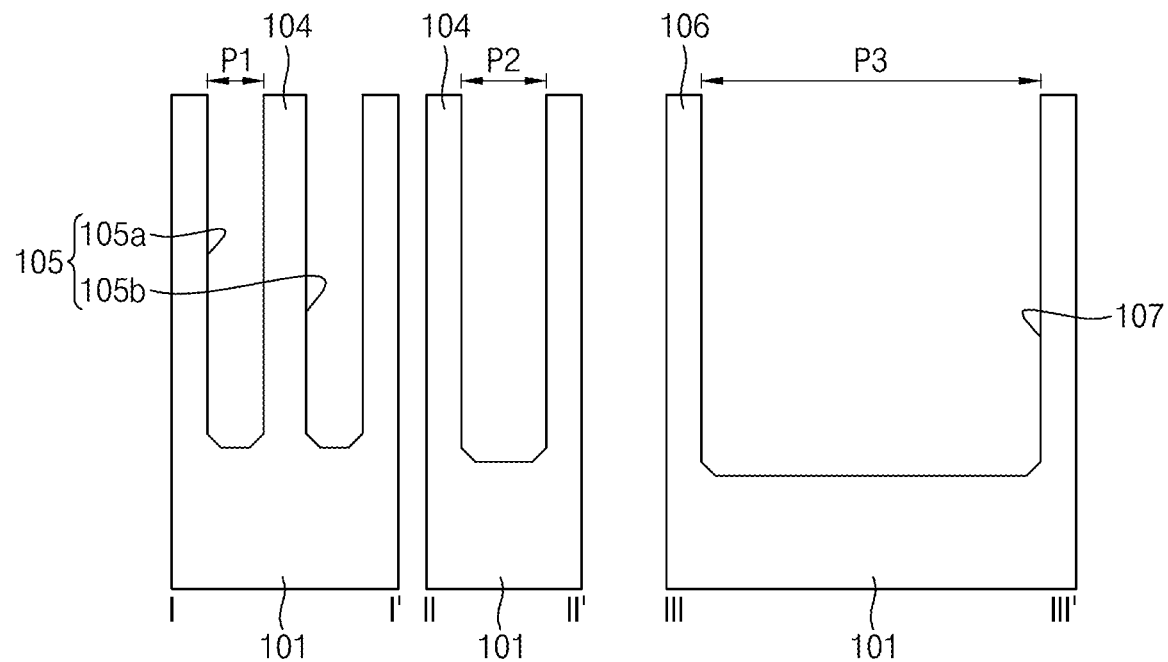
FIGS. 24 to 29 are diagrams illustrating a method of manufacturing a semiconductor device according to some embodiments of the inventive concept.

Referring to FIG. 24, a cell trench 105 defining a cell active region 104 may be formed in a first region Cell of a substrate 101, and a peripheral trench 107 defining a peripheral active region 106 may be formed in a second region Core/Peri. The cell trench 105 may be formed to have a depth smaller than a depth of the peripheral trench 107 of the second region Core/Peri due to a loading effect and/or a reactive ion etching (RIE) lag.

The cell trench 105 may include a first cell trench 105a having a relatively small width P1 and a second cell trench 105b having a relatively large width P2. For example, the cell trench 105 may include the first cell trench 105a having a different depth from a depth of the second cell trench 105b. For example, the depth of the second cell trench 105b may be greater than the depth of the first cell trench 105a due to the RIE lag.

The peripheral trench 107 may have a third width P3 that is greater than the first width P1. Although the third width P3 is illustrated as being greater than the second width P2, embodiments of the inventive concept are not limited thereto, and the third width P3 may be less than the second width P2 or equal to the second width P2 in other embodiments.

Figure 25:
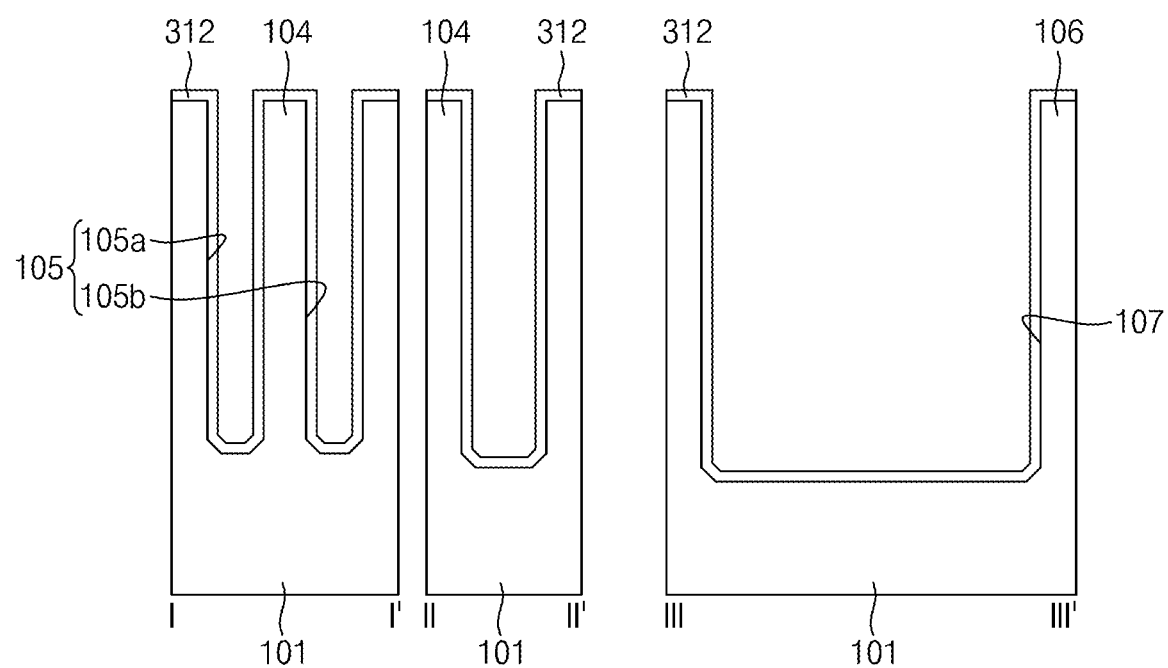

Referring to FIG. 25, a first insulating layer 312 may be formed on surfaces of the cell trench 105 and the peripheral trench 107 in the first region Cell and the second region Core/Peri. In some embodiments, a thickness of the first insulating layer 312 may be less than half of the first width P1. However, embodiments of the inventive concept are not limited thereto, and the first insulating layer 312 may be formed to a different thickness according to other embodiments of the inventive concept. The first insulating layer 312 may conformally at least partially cover inner walls of the cell trench 105 and the peripheral trench 107. For example, the first insulating layer 312 may serve to reduce a consumed amount of the cell active region 104 due to oxidation during a subsequent oxidation process, obtain a needed area of the cell active region 104, and improve switching characteristics of a cell transistor.

For example, the first insulating layer 312 may include a silicon oxide film. The first insulating layer 312 may be formed using an atomic layer deposition (ALD) process, a chemical vapor deposition (CVD) process, a radical oxidation process, a natural oxidation process, or the like.

Figure 26:
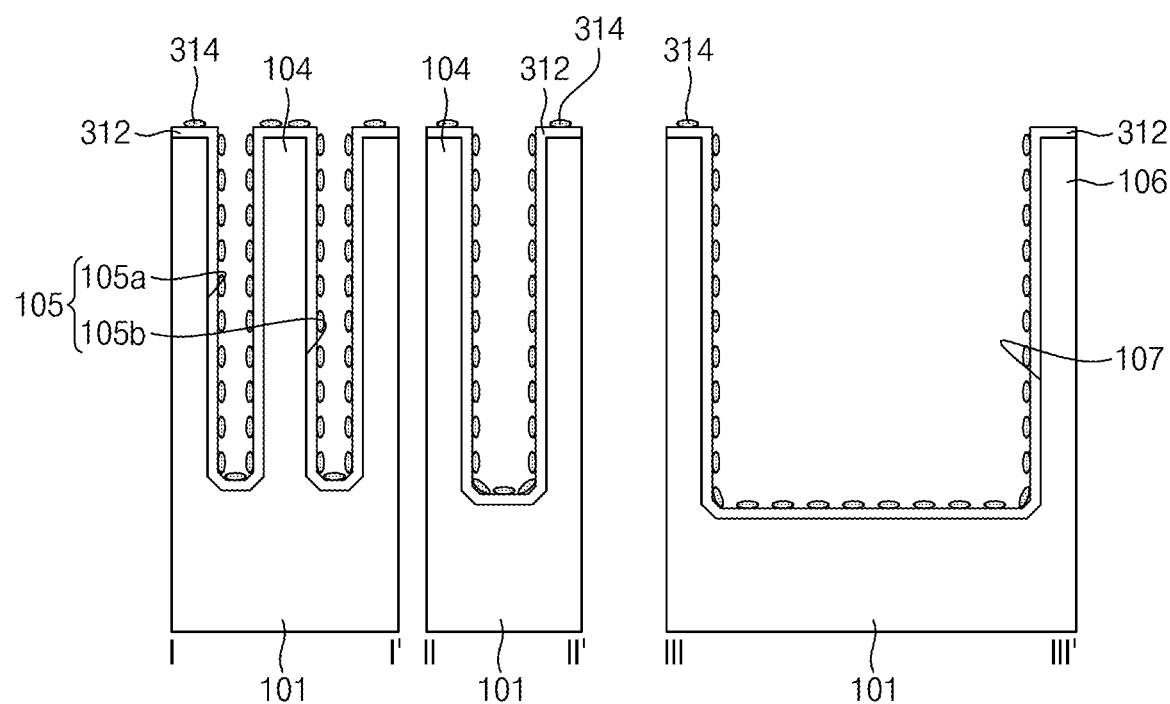

Referring to FIG. 26, a shielding layer 314 may be formed on the first insulating layer 312 in the first region Cell and the second region Core/Peri. In some embodiments of the inventive concept, the shielding layer 314 may be formed of a plurality of particles.

For example, the plurality of particles may be formed using a CVD process or an epitaxial growth process. In some embodiments, hexachlorodisilane (HCD, $Si_2Cl_6$), dichlorosilane (DCS, $SiH_2Cl_2$), silane, or disilane may be used as a source gas for a process of forming the plurality of particles. The plurality of particles may be formed using a process of forming particles on the first insulating layer 312 and formed by omitting an operation of forming a seed layer on the first insulating layer 312. That is, the plurality of particles spaced apart from each other may be formed by performing a fine particle forming process directly on the first insulating layer 312 without using a precursor (e.g., a fine metal film) serving as a seed on the first insulating layer 312. For example, the shielding layer 314 including the plurality of particles may be formed using an ALD process or a CVD process.

Figure 27:
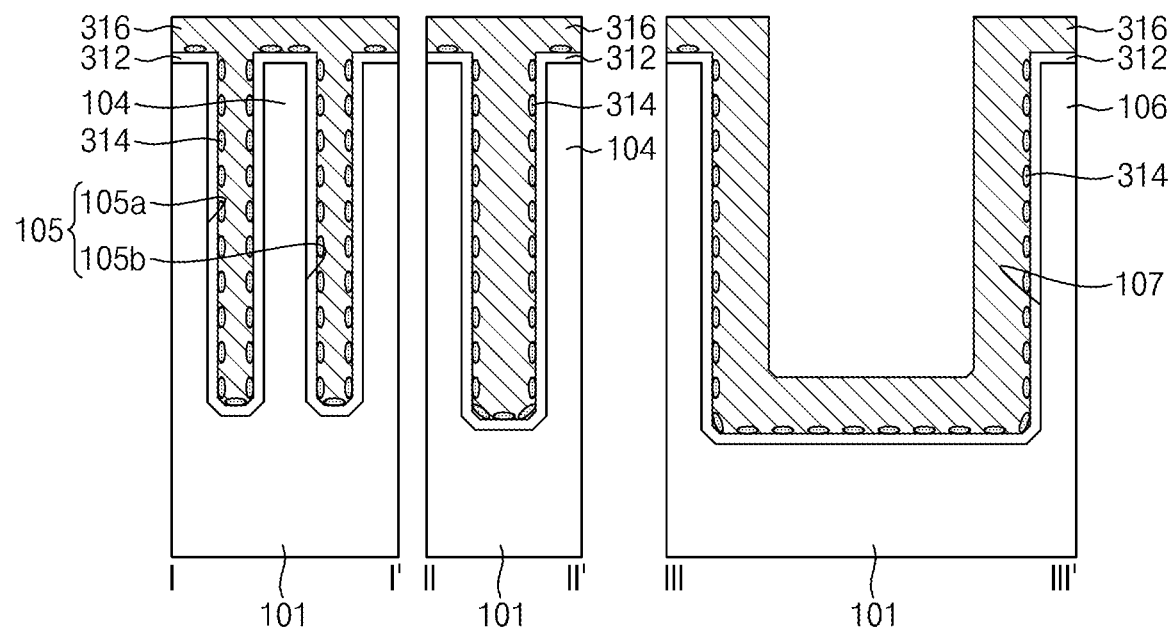

Referring to FIG. 27, a second insulating layer 316 may be formed to at least partially cover the first insulating layer 312 and the shielding layer 314. In some embodiments of the inventive concept, the sum of a thickness of the second insulating layer 316 and the thickness of the first insulating layer 312 may be less than half the third width P3 so that the remaining space may be left in the peripheral trench 107.

For example, the second insulating layer 316 may include a silicon oxide film. The second insulating layer 316 may be formed using an ALD process. In other embodiments, the second insulating layer 316 may be formed using a CVD process, a radical oxidation process, a natural oxidation process, or the like.

Figure 28:
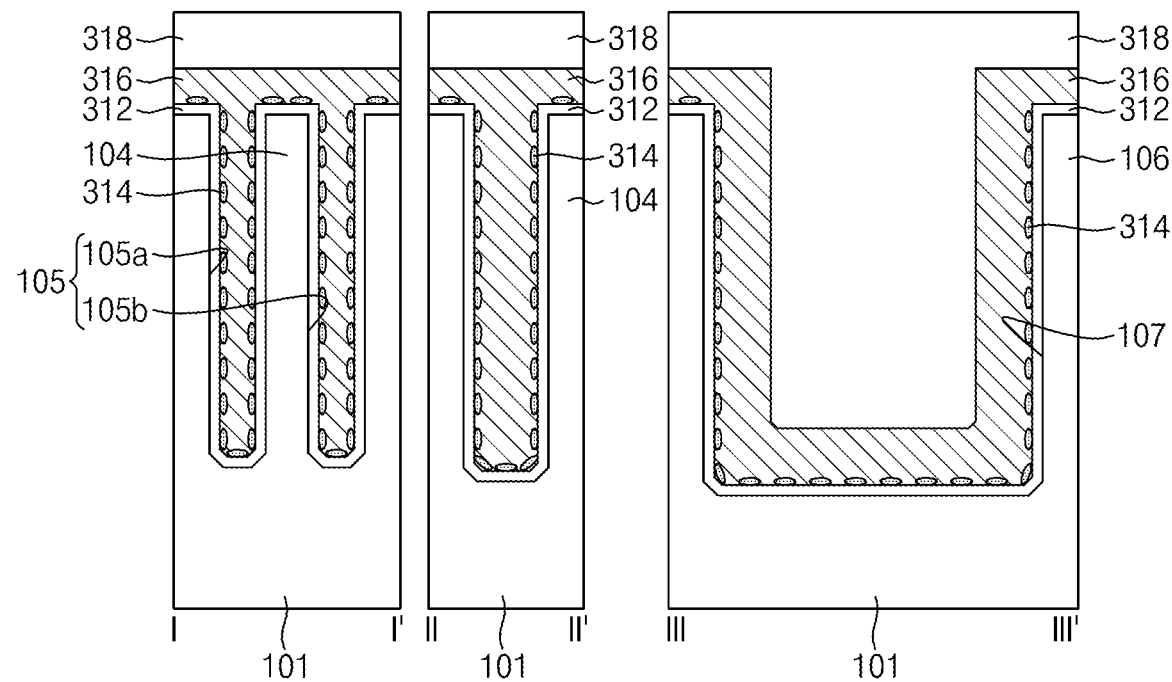

Referring to FIG. 28, a third insulating layer 318 may be formed on the second insulating layer 316. The third insulating layer 318 may be formed to a sufficient thickness to partially or completely fill the remaining space of the peripheral trench 107. However, embodiments of the inventive concept are not limited thereto.

As an example, a gap-fill insulating layer may be formed of an oxide film. The gap-fill insulating layer may be formed of one or more materials including, but not limited to, Tonen SilaZen (TOSN), high-density plasma (HDP) oxide, flowable oxide (FOX), spin on glass (SOG), undoped silica glass (USG), tetraethyl ortho silicate (TEOS), and low-temperature oxide (LTO).

Figure 29:
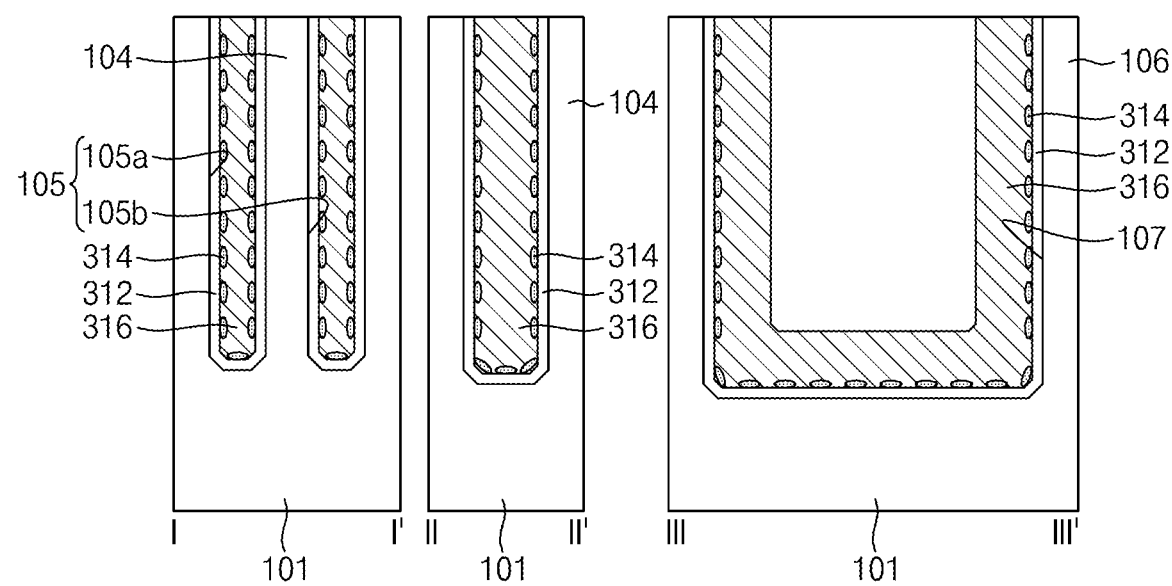

Referring to FIG. 29, a planarization process may be performed until top surfaces of the cell active region 104 and the peripheral active region 106 are exposed. Due to the planarization process, a top surface of a cell device isolation layer 110 may be at the same level as a top surface of a peripheral device isolation layer 120 so as to be substantially coplanar therewith.

Figure 30:
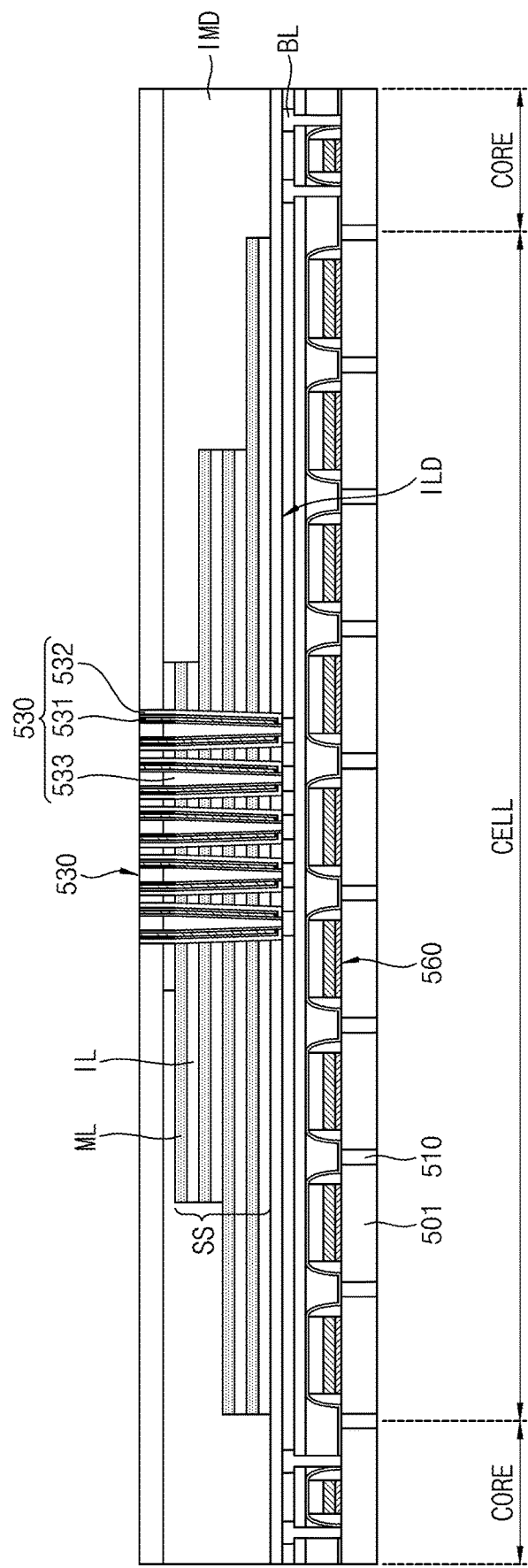
FIG. 30 is a cross-sectional view of a semiconductor device according to further embodiments of the inventive concept.

FIG. 30 is a cross-sectional view of a semiconductor device according to some embodiments of the inventive concept.

Referring to FIG. 30, the semiconductor device may include an active region 501, a device isolation layer 510, a gate structure 560, a first interlayer insulating layer ILD, a stack structure SS, a second interlayer insulating layer IMD, and a vertical structure 530 formed on a semiconductor substrate.

The device isolation layer 510 may define the active region 501. In some embodiments of the inventive concept, the device isolation layer 510 may include a first insulating layer, a shield layer, and a second insulating layer as described above with reference to FIGS. 1A, 1D, and 1E to 1K.

The gate structure 560 may be disposed on the active region 501, and the first interlayer insulating layer ILD and the stack structure SS may be disposed on the gate structure 560. The stack structure SS may include a plurality of insulating layers IL and a plurality of semiconductor layers ML that are stacked alternately and repeatedly. For example, the insulating layer IL may include one or more materials including, but not limited to, a silicon oxide film, a silicon nitride film, a silicon oxynitride film, a carbon-containing silicon oxide film, a carbon-containing silicon nitride film, and a carbon-containing silicon oxynitride film. The semiconductor layer ML may include a semiconductor material. The semiconductor material may be an amorphous semiconductor material or a polycrystalline semiconductor material.

The stack structure SS may include a larger number of insulating layers IL and a larger number of semiconductor layers ML than shown in FIG. 30 in accordance with various embodiments of the inventive concept. A relatively lower end of the stack structure SS may protrude more than a relatively higher end of the stack structure SS in a lateral direction in a cross sectional view of the semiconductor device (relative to the semiconductor substrate as described above).

A through hole may be formed to vertically pass through the stack structure SS. A vertical structure 530 may be disposed in so as to partially fill or fill the through hole. The vertical structure 530 may include a conductive line 531, an insulating line 532, and a vertical pattern 533, which extend in a substantially vertical direction in a cross sectional view of the semiconductor device. The conductive line 531 may include a conductive material, which may be any one or more of a doped semiconductor material, a conductive metal nitride, a metal, and a metal-semiconductor compound. The conductive line 531 may constitute a word line WL.

According to the example embodiments of the inventive concept, in a semiconductor device, a device isolation layer can include a shielding layer having conductivity. An HEIP phenomenon can be mitigated or prevented by the shielding layer. A potential well for both electrons e– and holes h+ can be formed in a nitride pattern and, thus, accumulation of charges can be inhibited. As a result, characteristics of a transistor can be preserved or inhibited from changing. Furthermore, the shielding layer can include a plurality of particles spaced apart from each other so that a conductive structure disposed across the device isolation layer can be in contact with the shielding layer, thereby reducing or preventing degradation of a device operation.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
   a trench defining an active region in a substrate;
   a first insulating layer on a bottom surface and side surfaces of the active region inside the trench;
   a shielding layer arranged on a surface of the first insulating layer and exposing a portion of the surface of the first insulating layer;
   a second insulating layer arranged on the shielding layer and contacting the exposed portion of the surface of the first insulating layer along the bottom surface and the side surfaces of the active region inside the trench; and
   a gap-fill insulating layer on the second insulating layer and being separated from the first insulating layer by the second insulating layer, such that the gap-fill insulating layer does not directly contact the first insulating layer,
   wherein the first insulating layer includes at least one protrusion that protrudes over the surface of the first insulating layer and that contacts the second insulating layer.

2. The semiconductor device of claim 1, wherein the at least one protrusion of the first insulating layer is arranged on an inner side surface of the first insulating layer and protrudes toward the gap-fill insulating layer.

3. The semiconductor device of claim 1, wherein the at least one protrusion of the first insulating layer is arranged at a position having a depth of about 100 Å or less from a top surface of the substrate.

4. The semiconductor device of claim 1, wherein the shielding layer includes a plurality of particles that are spaced apart from each other.

5. The semiconductor device of claim 4, wherein the plurality of particles of the shielding layer are arranged on an inner side surface of the first insulating layer.

6. The semiconductor device of claim 4, wherein the at least one protrusion of the first insulating layer is arranged above the plurality of particles of the shielding layer.

7. The semiconductor device of claim 4, wherein one of the plurality of particles of the shielding layer is in contact with the at least one protrusion of the first insulating layer.

8. The semiconductor device of claim 4, wherein the at least one protrusion of the first insulating layer includes a first protrusion and a second protrusion below the first protrusion,
   wherein the plurality of particles of the shielding layer includes a first particle and a second particle above the first particle, and
   wherein the second protrusion of the at least one protrusion of the first insulating layer is in contact with the second particle of the plurality of particles of the shielding layer.

9. The semiconductor device of claim 8, wherein the second protrusion of the at least one protrusion of the first insulating layer is smaller than the first protrusion of the at least one protrusion of the first insulating layer, and
   wherein the second particle of the plurality of particles of the shielding layer is smaller than the first particle of the plurality of particles of the shielding layer.

10. The semiconductor device of claim 8, wherein the second protrusion of the at least one protrusion of the first insulating layer is disposed above the second particle of the plurality of particles of the shielding layer.

11. The semiconductor device of claim 4, wherein one of the plurality of particles of the shielding layer is in contact with the at least one protrusion of the first insulating layer and is arranged between the at least one protrusion of the first insulating layer and the second insulating layer.

12. A semiconductor device comprising:
   a trench defining an active region in a substrate;
   a first insulating layer on a bottom surface and side surfaces of the active region inside the trench;
   a shielding layer on the first insulating layer;
   a second insulating layer arranged on the shielding layer and covering the bottom surface and the side surfaces of the active region inside the trench; and
   a gap-fill insulating layer on the second insulating layer,
   wherein the second insulating layer includes at least one recess region on at least one of outer side surfaces and an outer bottom surface of the second insulating layer, and wherein the shielding layer is in contact with a first portion of one of the at least one recess region of the second insulating layer while a second portion of the one of the at least one recess region of the second insulating layer is free of the shielding layer.

13. The semiconductor device of claim 12, wherein the first insulating layer includes at least one protrusion on at least one of inner side surfaces of the first insulating layer, and wherein the at least one protrusion of the first insulating layer is in contact with the at least one recess region of the second insulating layer.

14. The semiconductor device of claim 12, wherein the shielding layer includes a plurality of particles that are spaced apart from each other, and wherein one of the plurality of particles of the shielding layer is in contact with the at least one recess region of the second insulating layer.

15. The semiconductor device of claim 12, wherein the shielding layer includes a liner layer on the at least one of the outer side surfaces and the outer bottom surface of the second insulating layer, and wherein the liner layer of the shielding layer is in contact with the at least one recess region of the second insulating layer.

16. The semiconductor device of claim 12, wherein the second insulating layer is in partial contact with inner side surfaces and an inner bottom surface of the first insulating layer.

\* \* \* \* \*